(12) United States Patent
Takahashi et al.

(10) Patent No.: US 7,233,889 B2
(45) Date of Patent: Jun. 19, 2007

(54) METHOD, APPARATUS, AND COMPUTER PROGRAM FOR EVALUATING NOISE IMMUNITY OF A SEMICONDUCTOR DEVICE

(75) Inventors: Eiji Takahashi, Osaka (JP); Yoshiyuki Saito, Katano (JP); Yukihiro Fukumoto, Hirakata (JP); Hiroshi Benno, Kanano (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 694 days.

(21) Appl. No.: 10/278,507

(22) Filed: Oct. 23, 2002

(65) Prior Publication Data

US 2003/0083857 A1 May 1, 2003

(30) Foreign Application Priority Data

Oct. 25, 2001 (JP) .............................. 2001-327336

(51) Int. Cl.
*G06F 17/50* (2006.01)
(52) U.S. Cl. ..................... 703/14; 716/4; 716/5; 716/15
(58) Field of Classification Search ................. 703/14; 324/750, 765, 762, 613
See application file for complete search history.

(56) References Cited

U.S. PATENT DOCUMENTS 4,481,628 A * 11/1984 Pasquinelli ................. 714/745
5,883,521 A * 3/1999 Nishikawa ................... 324/765
5,901,305 A     5/1999 Futagami
6,173,427 B1 * 1/2001 Tsukagoshi ................. 714/724
6,281,697 B1 * 8/2001 Masuda et al. ............. 324/765
6,429,676 B1 * 8/2002 Chun et al. ................. 324/765
6,549,019 B2 * 4/2003 Nielsen ....................... 324/628
2002/0017912 A1 * 2/2002 Tamaki et al. .............. 324/750

OTHER PUBLICATIONS

George A. Katopis (IEEE 1985) teaches a (Delta-I noise Specification for High-Performance Computing Machine).*

* cited by examiner

*Primary Examiner*—Paul Rodriguez
*Assistant Examiner*—Andre Pierre-Louis

(57) ABSTRACT

A method of evaluating noise immunity of a semiconductor device is provided. An actual circuit including the semiconductor device is represented by an equivalent circuit which has a target equivalent circuit, a noise source equivalent circuit, and an external equivalent circuit connected in parallel. The target equivalent circuit represents the semiconductor device. The noise source equivalent circuit represents a noise source outside the semiconductor device, and supplies noise to the target equivalent circuit. The external equivalent circuit represents a circuit outside the semiconductor device. The noise immunity is evaluated based on a voltage or current which arises in the target equivalent circuit by the noise. In this way, the immunity of the semiconductor device against extraneous noise can be evaluated in consideration of the effects of the circuitry outside the semiconductor device.

15 Claims, 13 Drawing Sheets

METHOD, APPARATUS, AND COMPUTER PROGRAM FOR EVALUATING NOISE IMMUNITY OF A SEMICONDUCTOR DEVICE

This application is based on an application No. 2001-327336 filed in Japan, the contents of which are hereby incorporated by reference.

BACKGROUND OF THE INVENTION

1. Field of the Invention

The present invention relates to a method and apparatus for evaluating noise immunity of a semiconductor device.

2. Related Art

Conventionally, noise immunity evaluation of a semiconductor device during the design phase is carried out by performing circuit simulations using an equivalent circuit of the semiconductor device. One example of such a noise immunity evaluation method is disclosed as "Device and Method for Simulation for Semiconductor Integrated Circuit" in Unexamined Japanese Patent Application Publication No. H07-262263.

FIG. 13 shows an equivalent circuit representing a semiconductor integrated circuit (hereafter referred to as a "semiconductor device") which is evaluated using this example conventional method.

In the drawing, an equivalent circuit 1300 includes terminals 1301 and 1302, logic equivalent circuits 1331-1334, resistors 1311-1314, and inductors 1321-1324. The terminal 1301 represents a power supply terminal of the semiconductor device. The terminal 1302 represents a ground terminal of the semiconductor device. The logic equivalent circuits 1331-1334 each represent a different one of a plurality of circuit blocks of the semiconductor device. The resistors 1311-1314 and the inductors 1321-1324 represent power supply paths over which power is supplied to the corresponding circuit blocks.

In this conventional method, the logical behavior of each of the logic equivalent circuits 1331-1334 is examined to find the power consumption and output signal delay of the logic equivalent circuit. The power consumption and output signal delay are then used to calculate the flow of current through the logic equivalent circuit and its maximum rate of change. Further, a counterelectromotive force generated in the corresponding power supply path is calculated from the flow of current, the maximum rate of change, the resistance of the corresponding resistor, and the inductance of the corresponding inductor. A sum-total of the counterelectromotive forces calculated for the logic equivalent circuits 1331-1334 is compared with a predetermined tolerance level, and the comparison result is output.

By comparing the sum-total of the counterelectromotive forces with the predetermined tolerance level in this way, the probability of malfunction in the semiconductor device can be judged. The immunity of the semiconductor device from switching noise can be evaluated based on this judgement.

However, the conventional method evaluates only the immunity of the semiconductor device from switching noise that occurs within the semiconductor device, and cannot evaluate the immunity of the semiconductor device from so-called extraneous noise, which is introduced into the semiconductor device from outside.

Also, though a semiconductor device is usually connected to an external circuit to achieve its function, the conventional method does not take the effects of such an external circuit into account.

SUMMARY OF THE INVENTION

In view of the above problem, the first object of the present invention is to provide a method and apparatus that can evaluate immunity of a semiconductor device against extraneous noise.

The second object of the present invention is to provide a method and apparatus that can evaluate noise immunity of a semiconductor device in consideration of the effects of circuitry outside the semiconductor device.

(1) The present invention is a method of evaluating noise immunity of a semiconductor device, using an equivalent circuit that represents an actual circuit which includes the semiconductor device and a noise source outside the semiconductor device, the equivalent circuit including a target circuit and a noise circuit which are connected with each other, the target circuit representing the semiconductor device whereas the noise circuit representing the noise source and supplying noise to the target circuit, the target circuit including a logic circuit and at least one of a power circuit and a ground circuit which are connected in series with each other, the logic circuit representing a logic part of the semiconductor device, the power circuit representing a power supplying part of the semiconductor device including power pins and wiring, the ground circuit representing a grounding part of the semiconductor device including ground pins and wiring, the method including the steps of: calculating at least one of (a) a voltage arising in the logic circuit due to the noise and (b) a current flowing through the target circuit due to the noise, using an impedance of each circuit in the target circuit; and evaluating the noise immunity of the semiconductor device according to the calculation result.

With this construction, the equivalent circuit includes the target circuit which represents the semiconductor device and the noise circuit which represents the noise source outside the semiconductor device. This being so, the noise immunity of the semiconductor device is evaluated based on the voltage or current which is caused in the target circuit by the noise input from the noise circuit. Hence the immunity of the semiconductor device against extraneous noise can be evaluated.

(2) In the noise immunity evaluation method of (1), the equivalent circuit may further include an external circuit representing a circuit which is included in the actual circuit and is located outside the semiconductor device, the external circuit, the target circuit, and the noise circuit being connected in parallel with each other, wherein the calculating step performs the calculation, further using an impedance of the external circuit.

With this construction, the equivalent circuit also includes the external circuit which represents the circuit outside the semiconductor device. This enables the noise immunity of the semiconductor device to be evaluated in consideration of the effects of external circuitry.

(3) In the noise immunity evaluation method of (1), the logic part of the semiconductor device may include a plurality of circuit blocks, wherein the logic circuit in the equivalent circuit includes a plurality of block circuits which are in a one-to-one correspondence with the plurality of circuit blocks and are connected in parallel with each other, each block circuit includes a block logic circuit and at least one of a block power circuit and a block ground circuit which are connected in series with each other, the block logic circuit representing a logic part of a corresponding circuit block, the block power circuit representing a power supplying part of the corresponding circuit block including power wiring, and the block ground circuit representing a grounding part of the corresponding circuit block including ground wiring, and the calculating step calculates at least one of: (1) a voltage arising in the block logic circuit in each block circuit due to the noise; (2) a voltage arising in the block power circuit in each block circuit due to the noise; (3) a voltage arising in the block ground circuit in each block circuit due to the noise; and (4) a current flowing through each block circuit due to the noise, using an impedance of the power circuit, an impedance of the ground circuit, and an impedance of each circuit included in the plurality of block circuits.

With this construction, the voltages or currents which arise in the block circuits due to the noise are calculated. Accordingly, the possibility of malfunction can be judged based on the difference in absolute value or phase of the voltages or currents between the circuit blocks. This enables the immunity of the semiconductor device against extraneous noise to be evaluated in consideration of the relations between the circuit blocks.

(4) In the noise immunity evaluation method of (3), the equivalent circuit may further include an external circuit representing a circuit which is included in the actual circuit and is located outside the semiconductor device, the external circuit, the target circuit, and the noise circuit being connected in parallel with each other, wherein the calculating step performs the calculation, further using an impedance of the external circuit.

With this construction, the equivalent circuit further includes the external circuit which represents the circuit outside the semiconductor device. This enables the noise immunity of the semiconductor device to be evaluated in consideration of the effects of external circuitry.

(5) Also, the present invention is a method of evaluating noise immunity of a semiconductor device, using an equivalent circuit that represents an actual circuit which includes the semiconductor device and a plurality of noise sources outside the semiconductor device, the semiconductor device including a plurality of circuit blocks which are each influenced by a different one of the plurality of noise sources, the equivalent circuit including a plurality of partial circuits which are in a one-to-one correspondence with the plurality of circuit blocks, the plurality of partial circuits being connected to the same ground, each partial circuit including a block circuit and a noise circuit which are connected with each other, the block circuit representing a corresponding circuit block, whereas the noise circuit representing a noise source which influences the corresponding circuit block and supplying noise to the block circuit, the block circuit including a block logic circuit and at least one of a block power circuit and a block ground circuit which are connected in series with each other, the block logic circuit representing a logic part of the corresponding circuit block, the block power circuit representing a power supplying part of the corresponding circuit block including power wiring, and the block ground circuit representing a grounding part of the corresponding circuit block including ground wiring, the method including the steps of: calculating at least one of: (1) a voltage arising in the block logic circuit of the block circuit in each partial circuit due to the noise; (2) a voltage arising in the block power circuit of the block circuit in each partial circuit due to the noise; (3) a voltage arising in the block ground circuit of the block circuit in each partial circuit due to the noise; and (4) a current flowing through the block circuit in each partial circuit due to the noise, using an impedance of each circuit of the block circuit in each partial circuit; and evaluating the noise immunity of the semiconductor device according to the calculation result.

With this construction, the voltages or currents which arise in the block circuits due to different noise are calculated. Accordingly, the possibility of malfunction can be judged based on the difference in absolute value or phase of the voltages or currents between the circuit blocks. Suppose the semiconductor device receives power from a plurality of power supply systems. The noise immunity of this semiconductor device can be evaluated in consideration of the relations between a plurality of circuit blocks which are each subjected to noise from a different one of the plurality of power supply systems.

(6) In the noise immunity evaluation method of (5), each partial circuit in the equivalent circuit may further include an external circuit representing a circuit which is included in the actual circuit and is located outside the semiconductor device, the external circuit, the block circuit, and the noise circuit being connected in parallel with each other, wherein the calculating step performs the calculation, further using an impedance of the external circuit in each partial circuit.

With this construction, the equivalent circuit further includes the external circuit which represents the circuit outside the semiconductor device. This enables the noise immunity of the semiconductor device to be evaluated in consideration of the effects of external circuitry.

(7) Also, the present invention is an apparatus of evaluating noise immunity of a semiconductor device, using an equivalent circuit that represents an actual circuit which includes the semiconductor device and a noise source outside the semiconductor device, the equivalent circuit including a target circuit and a noise circuit which are connected with each other, the target circuit representing the semiconductor device, whereas the noise circuit representing the noise source and supplying noise to the target circuit, the target circuit including a logic circuit and at least one of a power circuit and a ground circuit which are connected in series with each other, the logic circuit representing a logic part of the semiconductor device, the power circuit representing a power supplying part of the semiconductor device including power pins and wiring, the ground circuit representing a grounding part of the semiconductor device including ground pins and wiring, the apparatus including: a storing unit for storing an impedance of each circuit included in the target circuit; a calculating unit for calculating at least one of (a) a voltage arising in the logic circuit due to the noise and (b) a current flowing through the target circuit due to the noise, using the impedance of each circuit stored in the storing unit; and an evaluating unit for evaluating the noise immunity of the semiconductor device according to the calculation result.

With this construction, the same effects as the noise immunity evaluation method of (1) can be achieved.

(8) In the noise immunity evaluation apparatus of (7), the equivalent circuit may further include an external circuit representing a circuit which is included in the actual circuit and is located outside the semiconductor device, the external circuit, the target circuit, and the noise circuit being connected in parallel with each other, wherein the storing unit further stores an impedance of the external circuit, and the calculating unit performs the calculation, further using the impedance of the external circuit stored in the storing unit.

With this construction, the same effects as the noise immunity evaluation method of (2) can be achieved.

(9) In the noise immunity evaluation apparatus of (7), the logic part of the semiconductor device may include a plurality of circuit blocks, wherein the logic circuit in the equivalent circuit includes a plurality of block circuits which are in a one-to-one correspondence with the plurality of circuit blocks and are connected in parallel with each other, each block circuit includes a block logic circuit and at least one of a block power circuit and a block ground circuit which are connected in series with each other, the block logic circuit representing a logic part of a corresponding circuit block, the block power circuit representing a power supplying part of the corresponding circuit block including power wiring, and the block ground circuit representing a grounding part of the corresponding circuit block including ground wiring, the storing unit stores an impedance of the power circuit, an impedance of the ground circuit, and an impedance of each circuit included in the plurality of block circuits, and the calculating unit calculates at least one of: (1) a voltage arising in the block logic circuit in each block circuit due to the noise; (2) a voltage arising in the block power circuit in each block circuit due to the noise; (3) a voltage arising in the block ground circuit in each block circuit due to the noise; and (4) a current flowing through each block circuit due to the noise, using the impedances stored in the storing unit.

With this construction, the same effects as the noise immunity evaluation method of (3) can be achieved.

(10) In the noise immunity evaluation apparatus of (9), the equivalent circuit may further include an external circuit representing a circuit which is included in the actual circuit and is located outside the semiconductor device, the external circuit, the target circuit, and the noise circuit being connected in parallel with each other, wherein the storing unit further stores an impedance of the external circuit, and the calculating unit performs the calculation, further using the impedance of the external circuit stored in the storing unit.

With this construction, the same effects as the noise immunity evaluation method of (4) can be achieved.

(11) Also, the present invention is an apparatus of evaluating noise immunity of a semiconductor device, using an equivalent circuit that represents an actual circuit which includes the semiconductor device and a plurality of noise sources outside the semiconductor device, the semiconductor device including a plurality of circuit blocks which are each influenced by a different one of the plurality of noise sources, the equivalent circuit including a plurality of partial circuits which are in a one-to-one correspondence with the plurality of circuit blocks, the plurality of partial circuits being connected to the same ground, each partial circuit including a block circuit and a noise circuit which are connected with each other, the block circuit representing a corresponding circuit block, whereas the noise circuit representing a noise source which influences the corresponding circuit block and supplying noise to the block circuit, the block circuit including a block logic circuit and at least one of a block power circuit and a block ground circuit which are connected in series with each other, the block logic circuit representing a logic part of the corresponding circuit block, the block power circuit representing a power supplying part of the corresponding circuit block including power wiring, and the block ground circuit representing a grounding part of the corresponding circuit block including ground wiring, the apparatus including: a storing unit for storing an impedance of each circuit of the block circuit in each partial circuit; a calculating unit for calculating at least one of: (1) a voltage arising in the block logic circuit of the block circuit in each partial circuit due to the noise; (2) a voltage arising in the block power circuit of the block circuit in each partial circuit due to the noise; (3) a voltage arising in the block ground circuit of the block circuit in each partial circuit due to the noise; and (4) a current flowing through the block circuit in each partial circuit due to the noise, using the impedance of each circuit stored in the storing unit; and an evaluating unit for evaluating the noise immunity of the semiconductor device according to the calculation result.

With this construction, the same effects as the noise immunity evaluation method of (5) can be achieved.

(12) In the noise immunity evaluation apparatus of (11), each partial circuit in the equivalent circuit may further include an external circuit representing a circuit which is included in the actual circuit and is located outside the semiconductor device, the external circuit, the block circuit, and the noise circuit being connected in parallel with each other, wherein the storing unit further stores an impedance of the external circuit in each partial circuit, and the calculating unit performs the calculation, further using the impedance of the external circuit stored in the storing unit.

With this construction, the same effects as the noise immunity evaluation method of (6) can be achieved.

(13) Also, the present invention is a computer program which is executed by a computer to realize an apparatus of evaluating noise immunity of a semiconductor device, using an equivalent circuit that represents an actual circuit which includes the semiconductor device and a noise source outside the semiconductor device, the equivalent circuit including a target circuit and a noise circuit which are connected with each other, the target circuit representing the semiconductor device, whereas the noise circuit representing the noise source and supplying noise to the target circuit, the target circuit including a logic circuit and at least one of a power circuit and a ground circuit which are connected in series with each other, the logic circuit representing a logic part of the semiconductor device, the power circuit representing a power supplying part of the semiconductor device including power pins and wiring, the ground circuit representing a grounding part of the semiconductor device including ground pins and wiring, the computer program including the steps of: calculating at least one of (a) a voltage arising in the logic circuit due to the noise and (b) a current flowing through the target circuit due to the noise, using an impedance of each circuit in the target circuit; and evaluating the noise immunity of the semiconductor device according to the calculation result.

With this construction, the same effects as the noise immunity evaluation apparatus of (7) can be achieved.

(14) In the computer program of (13), the equivalent circuit may further include an external circuit representing a circuit which is included in the actual circuit and is located outside the semiconductor device, the external circuit, the target circuit, and the noise circuit being connected in parallel with each other, wherein the calculating step performs the calculation, further using an impedance of the external circuit.

With this construction, the same effects as the noise immunity evaluation apparatus of (8) can be achieved.

(15) In the computer program of (13), the logic part of the semiconductor device may include a plurality of circuit blocks, wherein the logic circuit in the equivalent circuit includes a plurality of block circuits which are in a one-to-one correspondence with the plurality of circuit blocks and are connected in parallel with each other, each block circuit includes a block logic circuit and at least one of a block power circuit and a block ground circuit which are connected in series with each other, the block logic circuit representing a logic part of a corresponding circuit block, the block power circuit representing a power supplying part of the corresponding circuit block including power wiring, and the block ground circuit representing a grounding part of the corresponding circuit block including ground wiring, and the calculating step calculates at least one of: (1) a voltage arising in the block logic circuit in each block circuit due to the noise; (2) a voltage arising in the block power circuit in each block circuit due to the noise; (3) a voltage arising in the block ground circuit in each block circuit due to the noise; and (4) a current flowing through each block circuit due to the noise, using an impedance of the power circuit, an impedance of the ground circuit, and an impedance of each circuit included in the plurality of block circuits.

With this construction, the same effects as the noise immunity evaluation apparatus of (9) can be achieved.

(16) In the computer program of (15), the equivalent circuit may further include an external circuit representing a circuit which is included in the actual circuit and is located outside the semiconductor device, the external circuit, the target circuit, and the noise circuit being connected in parallel with each other, wherein the calculating step performs the calculation, further using an impedance of the external circuit.

With this construction, the same effects as the noise immunity evaluation apparatus of (10) can be achieved.

(17) Also, the present invention is a computer program which is executed by a computer to realize an apparatus of evaluating noise immunity of a semiconductor device, using an equivalent circuit that represents an actual circuit which includes the semiconductor device and a plurality of noise sources outside the semiconductor device, the semiconductor device including a plurality of circuit blocks which are each influenced by a different one of the plurality of noise sources, the equivalent circuit including a plurality of partial circuits which are in a one-to-one correspondence with the plurality of circuit blocks, the plurality of partial circuits being connected to the same ground, each partial circuit including a block circuit and a noise circuit which are connected with each other, the block circuit representing a corresponding circuit block, whereas the noise circuit representing a noise source which influences the corresponding circuit block and supplying noise to the block circuit, the block circuit including a block logic circuit and at least one of a block power circuit and a block ground circuit which are connected in series with each other, the block logic circuit representing a logic part of the corresponding circuit block, the block power circuit representing a power supplying part of the corresponding circuit block including power wiring, and the block ground circuit representing a grounding part of the corresponding circuit block including ground wiring, the computer program including the steps of: calculating at least one of: (1) a voltage arising in the block logic circuit of the block circuit in each partial circuit due to the noise; (2) a voltage arising in the block power circuit of the block circuit in each partial circuit due to the noise; (3) a voltage arising in the block ground circuit of the block circuit in each partial circuit due to the noise; and (4) a current flowing through the block circuit in each partial circuit due to the noise, using an impedance of each circuit of the block circuit in each partial circuit; and evaluating the noise immunity of the semiconductor device according to the calculation result.

With this construction, the same effects as the noise immunity evaluation apparatus of (11) can be achieved.

(18) In the computer program of (17), each partial circuit in the equivalent circuit may further include an external circuit representing a circuit which is included in the actual circuit and is located outside the semiconductor device, the external circuit, the block circuit, and the noise circuit being connected in parallel with each other, wherein the calculating step performs the calculation, further using an impedance of the external circuit in each partial circuit.

With this construction, the same effects as the noise immunity evaluation apparatus of (12) can be achieved.

(19) Also, the present invention is a computer-readable storage medium storing any of the above computer programs (13) to (18).

With this construction, the effects described above can be achieved by distributing the computer program and executing it using a computer.

BRIEF DESCRIPTION OF THE DRAWINGS

These and other objects, advantages and features of the invention will become apparent from the following description thereof taken in conjunction with the accompanying drawings which illustrate a specific embodiment of the invention.

In the drawings.

DESCRIPTION OF THE PREFERRED EMBODIMENTS

First Embodiment

The following describes a method and apparatus for evaluating noise immunity of a semiconductor device in the first embodiment of the present invention, by referring to drawings.

In the first embodiment, noise immunity of a semiconductor device is evaluated using an equivalent circuit that represents an actual circuit including the semiconductor device. Such an equivalent circuit includes a target equivalent circuit representing the semiconductor device and a noise source equivalent circuit representing a noise source outside the semiconductor device.

(Equivalent Circuit)

Figure 1:
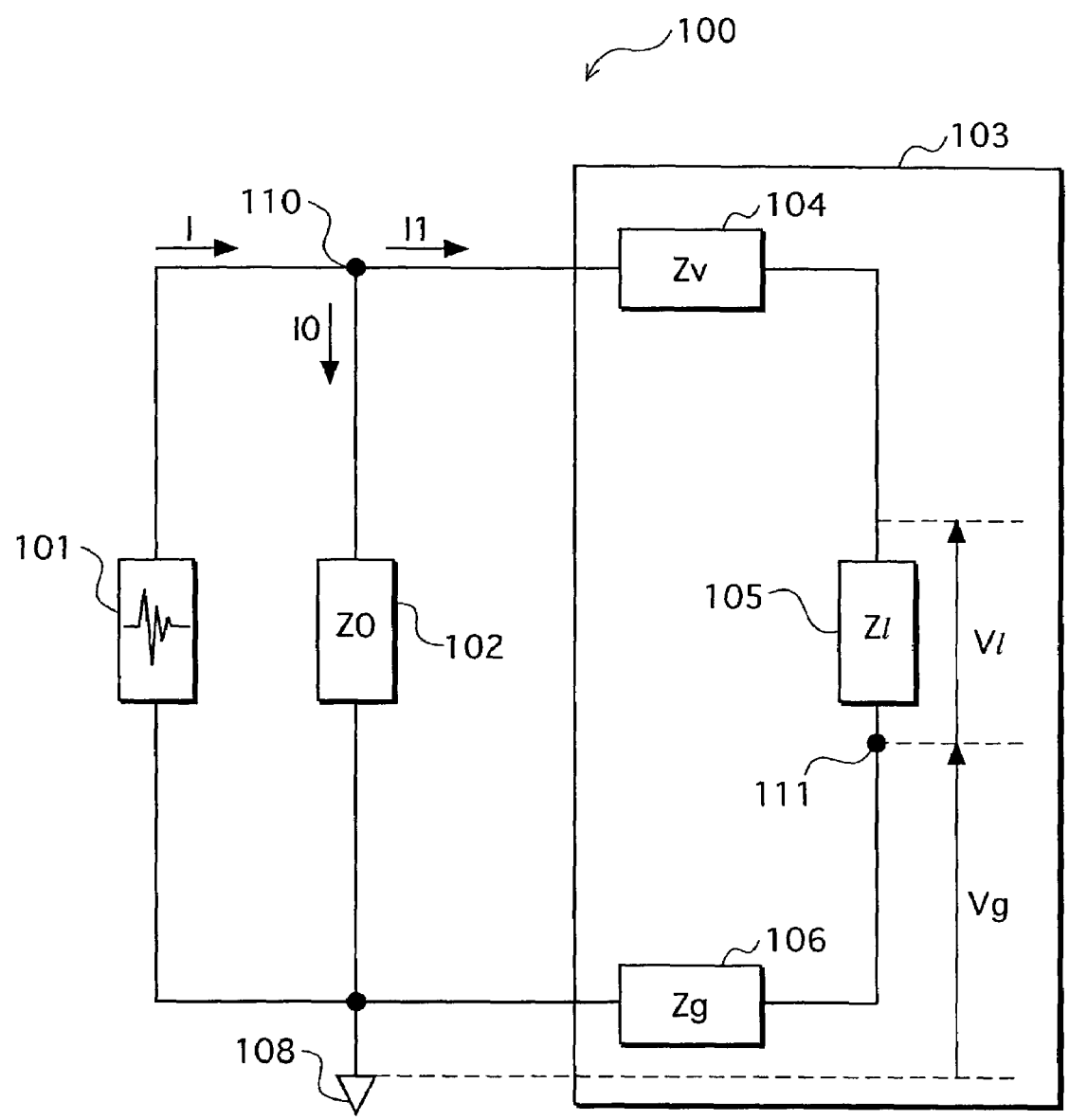
FIG. 1 shows an equivalent circuit representing an actual circuit in the first embodiment of the invention.

FIG. 1 shows an equivalent circuit representing an actual circuit in the first embodiment.

In the drawing, an equivalent circuit 100 includes a target equivalent circuit 103, a noise source equivalent circuit 101, and an external equivalent circuit 102 which are connected in parallel. The target equivalent circuit 103 represents a semiconductor device that is subjected to evaluation. The noise source equivalent circuit 101 represents a noise source outside the semiconductor device. The external equivalent circuit 102 represents a circuit outside the semiconductor device.

The target equivalent circuit 103 includes a power supplying part equivalent circuit 104, a logic part equivalent circuit 105, and a grounding part equivalent circuit 106 which are connected in series. The power supplying part equivalent circuit 104 represents a power supplying part of the semiconductor device, including power pins, leads, and bonding wires in a package and power wiring in a chip. The logic part equivalent circuit 105 represents a logic part of the semiconductor device, including logic circuits. The grounding part equivalent circuit 106 represents a grounding part of the semiconductor device, including ground pins, leads, and bonding wires in the package and ground wiring in the chip.

A ground 108 sets a reference voltage for the entire equivalent circuit 100. A node 110 represents a junction point between the external equivalent circuit 102 and the target equivalent circuit 103. A node 111 represents a connection point between the logic part equivalent circuit 105 and the grounding part equivalent circuit 106.

Here, an impedance of each component of the equivalent circuit 100 has been determined such that the equivalent circuit 100 represents the actual circuit, prior to the execution of the noise immunity evaluation.

Suppose a voltage which arises in the logic part equivalent circuit 105 due to noise caused by the noise source equivalent circuit 101 exceeds a maximum tolerance. This indicates there is a danger that the on/off state of a transistor formed in the logic part of the actual semiconductor device may change unexpectedly, thereby causing a malfunction. The maximum tolerance of the absolute value of this voltage above which the possibility of malfunction arises has been determined beforehand, too.

The impedances and the maximum tolerance are determined through logical computation, based on the factors such as the width and thickness of wiring and the thickness and dielectric constant of insulating layer which are shown by layout design information of the semiconductor device, as well as the operating characteristics of transistors formed in the semiconductor device. This determination is not the central feature of the present invention, so that its detailed explanation has been omitted here.

Noise Immunity Evaluation Apparatus

Figure 2:
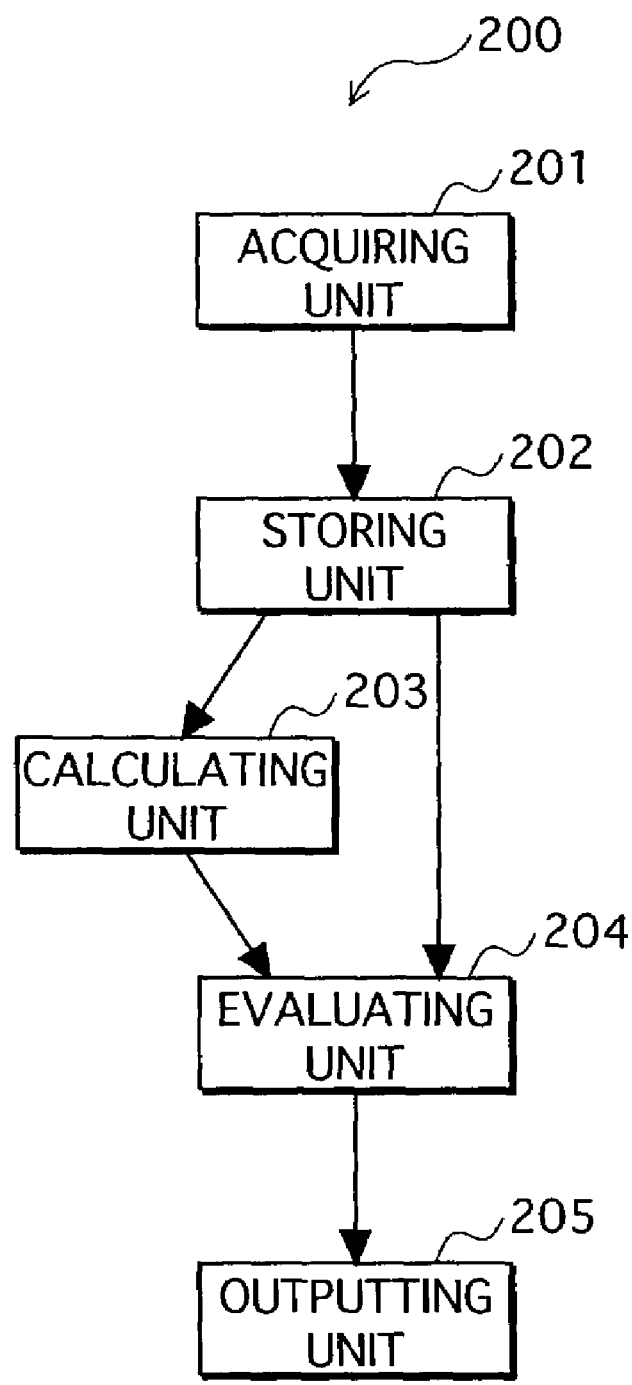
FIG. 2 is a block diagram showing a construction of a noise immunity evaluation apparatus of the first embodiment.

FIG. 2 is a block diagram showing a construction of the noise immunity evaluation apparatus of the first embodiment. This noise immunity evaluation apparatus evaluates the noise immunity of the semiconductor device, according to the noise immunity evaluation method of the first embodiment.

In FIG. 2, a noise immunity evaluation apparatus 200 is roughly made up of an acquiring unit 201, a storing unit 202, a calculating unit 203, an evaluating unit 204, and an outputting unit 205.

The noise immunity evaluation apparatus 200 is actually realized by a computer system that has a microprocessor, a ROM (read only memory), a RAM (random access memory), a hard disk device, and the like. The processes performed by the individual components of the noise immunity evaluation apparatus 200 are achieved by the microprocessor executing a program stored in the ROM. Also, information storage and information transfers between the components are conducted using the RAM and the hard disk device.

The acquiring unit 201 acquires the following:

(a) the impedances of the components of the target equivalent circuit 103 and the impedance of the external equivalent circuit 102;

(b) the value of current generated by the noise source equivalent circuit 101 corresponding to actual noise; and (c) the maximum tolerance for the absolute value of the voltage which arises in the logic part equivalent circuit 105 due to the noise.

Here, the impedances may be complex numbers. Also, the current may be a real number showing a direct current or a complex number showing an alternating current. Furthermore, the acquiring unit 201 may acquire a time-series value showing the change of the current with time.

The storing unit 202 stores the acquired impedances, current, and maximum tolerance.

The calculating unit 203 calculates the voltage which arises in the logic part equivalent circuit 105, from the impedances and current stored in the storing unit 202. This calculation can be done using a well-known method, such as by solving a circuit equation (which may be expressed as a differential equation), or by conducting a circuit simulation based on numerical computation.

The evaluating unit 204 judges whether the absolute value of the calculated voltage is greater than the maximum tolerance stored in the storing unit 202. If so, there is a probability of malfunction. Accordingly, the evaluating unit 204 judges the noise immunity of the semiconductor device as being poor. If the absolute value of the voltage is no greater than the maximum tolerance, on the other hand, there is no probability of malfunction. Accordingly, the evaluating unit 204 judges the noise immunity of the semiconductor device as being favorable. Alternatively, the evaluating unit 204 may use the difference between the absolute value of the voltage and the maximum tolerance as an index, to evaluate the noise immunity.

The outputting unit 205 outputs the evaluation result.

(Noise Immunity Evaluation Method)

Figure 3:
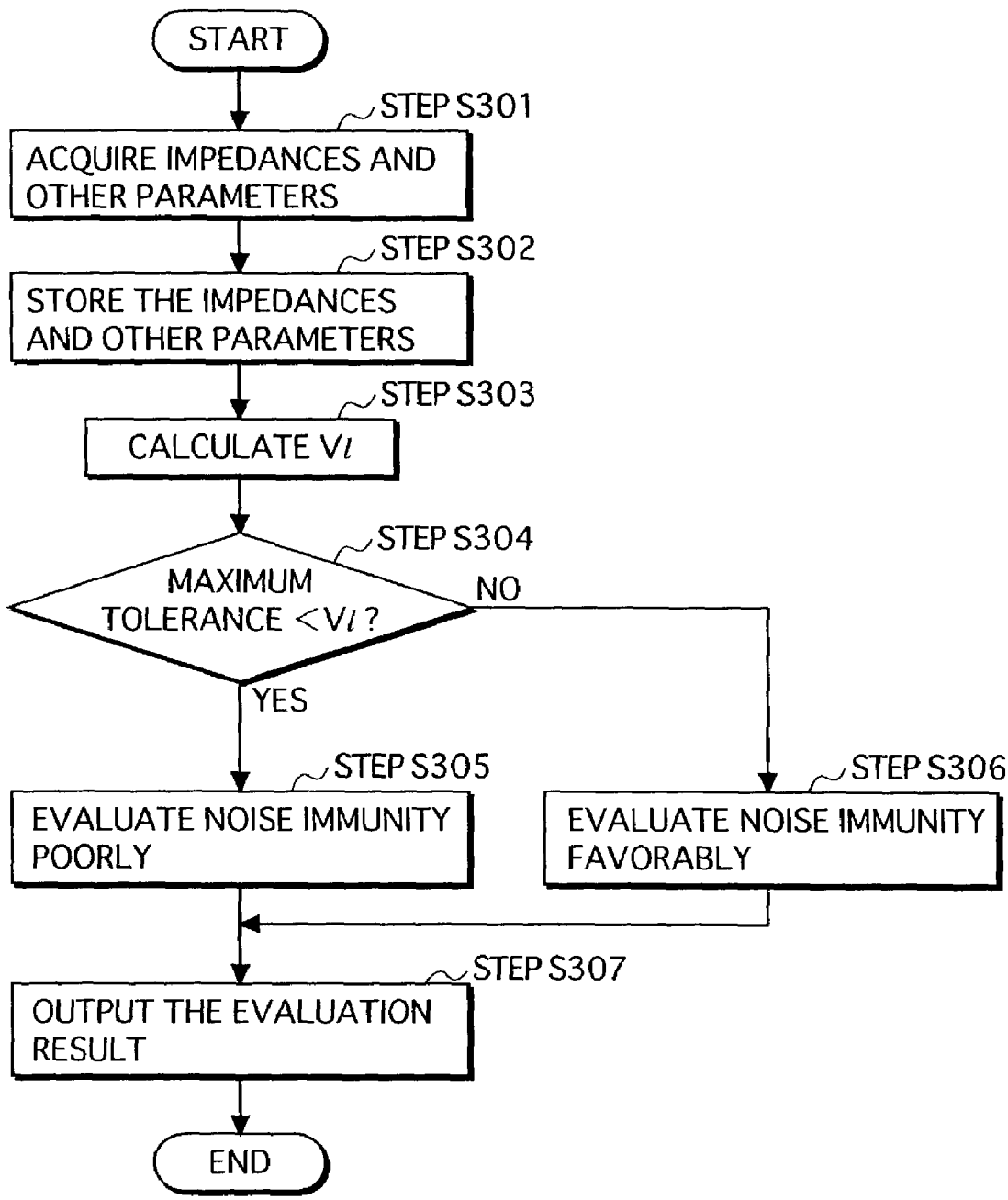
FIG. 3 is a flowchart showing a noise immunity evaluation method of the first embodiment.

FIG. 3 is a flowchart showing the noise immunity evaluation method of the first embodiment. The drawing shows the execution of the noise immunity evaluation method by the noise immunity evaluation apparatus 200.

The acquiring unit 201 acquires impedance Z0 of the external equivalent circuit 102 and the impedances of the components of the target equivalent circuit 103, i.e. impedance Zv of the power supplying part equivalent circuit 104, impedance Zl of the logic part equivalent circuit 105, and impedance Zg of the grounding part equivalent circuit 106. The acquiring unit 201 also acquires current I generated by the noise source equivalent circuit 101 and the aforementioned maximum tolerance (S301).

The storing unit 202 stores the acquired impedances, current, and maximum tolerance (S302).

The calculating unit 203 calculates voltage Vl arising in the logic part equivalent circuit 105, in the following way as one example.

Current I generated by the noise source equivalent circuit 101 branches out at the node 110, into current I0 flowing to the external equivalent circuit 102 and current I1 flowing to the target equivalent circuit 103. Here, current ratio K between current I and current I1 can be expressed by Equation 1:

$$K = \frac{I1}{I}$$ (Equation 1)
$$= \frac{Z0}{Zv + Zl + Zg + Z0}$$

This being so, voltage V1 arising in the logic part equivalent circuit 105 can be expressed by Equation 2:

$$V1 = I1 \cdot Zl$$ (Equation 2)
$$= K \cdot I \cdot Zl$$

Hence the ratio between current I and voltage V1 is:

$$\frac{V1}{I} = K \cdot Zl$$ (Equation 3)
$$= \frac{Z0 \cdot Zl}{Zv + Zl + Zg + Z0}$$

The calculating unit 203 assigns impedances Z0, Zv, Zl, and Zg and current I stored in the storing unit 202 to Equation 3, to find voltage V1 (S303).

The evaluating unit 204 compares the absolute value of voltage V1 and the maximum tolerance stored in the storing unit 202. If the absolute value of voltage V1 is greater than the maximum tolerance (S304: YES), the evaluating unit 204 judges that the noise immunity is poor (S305). Otherwise (S304: NO), the evaluating unit 204 judges that the noise immunity is favorable (S306).

The outputting unit 205 outputs the evaluation result (S307).

CONCLUSION

According to the noise immunity evaluation method of the first embodiment, an actual circuit including a semiconductor device that is subjected to evaluation is represented by an equivalent circuit which includes a target equivalent circuit representing the semiconductor device, a noise source equivalent circuit representing a noise source outside the semiconductor device, and an external equivalent circuit representing a circuit outside the semiconductor device. This being so, voltage V1 which arises in a logic part equivalent circuit in the target equivalent circuit is calculated, and the absolute value of voltage V1 is compared with a predetermined maximum tolerance. In this way, the immunity of the semiconductor device against extraneous noise can be evaluated in consideration of the effects of circuitry outside the semiconductor device.

As an alternative, the noise immunity may be evaluated by calculating a current flowing through the target equivalent circuit 103 and comparing the absolute value of the current with its maximum tolerance above which the possibility of malfunction arises. Since voltage V1 can be obtained by multiplying this current by impedance Zl, this method is substantially the same as that of the first embodiment.

Also, the noise generated by the noise source equivalent circuit 101 may be expressed by a voltage.

According to the first embodiment, the impedance of each circuit component and the noise current are assigned to the algebraic equation expressing the equivalent circuit. Accordingly, a solution can be obtained in the case where the noise is a direct current. Also, a sine-wave stationary solution can be obtained in the case where the noise is an alternating current. As an alternative, the equivalent circuit may be expressed by a differential equation to obtain a transient response, or a circuit simulation may be performed based on numerical computation to directly obtain a numerical solution.

Second Embodiment

The following describes a method and apparatus for evaluating noise immunity of a semiconductor device in the second embodiment of the present invention, by referring to drawings.

The second embodiment uses the equivalent circuit 100 (FIG. 1) like the first embodiment, but differs with the first embodiment in that the noise immunity is evaluated based on a voltage which arises in the grounding part equivalent circuit 106.

This difference with the first embodiment is described in detail below.

(Evaluation Principle)

The principle of noise immunity evaluation in the second embodiment is given below, based on a construction of a semiconductor device that is subjected to the evaluation.

Figure 4:
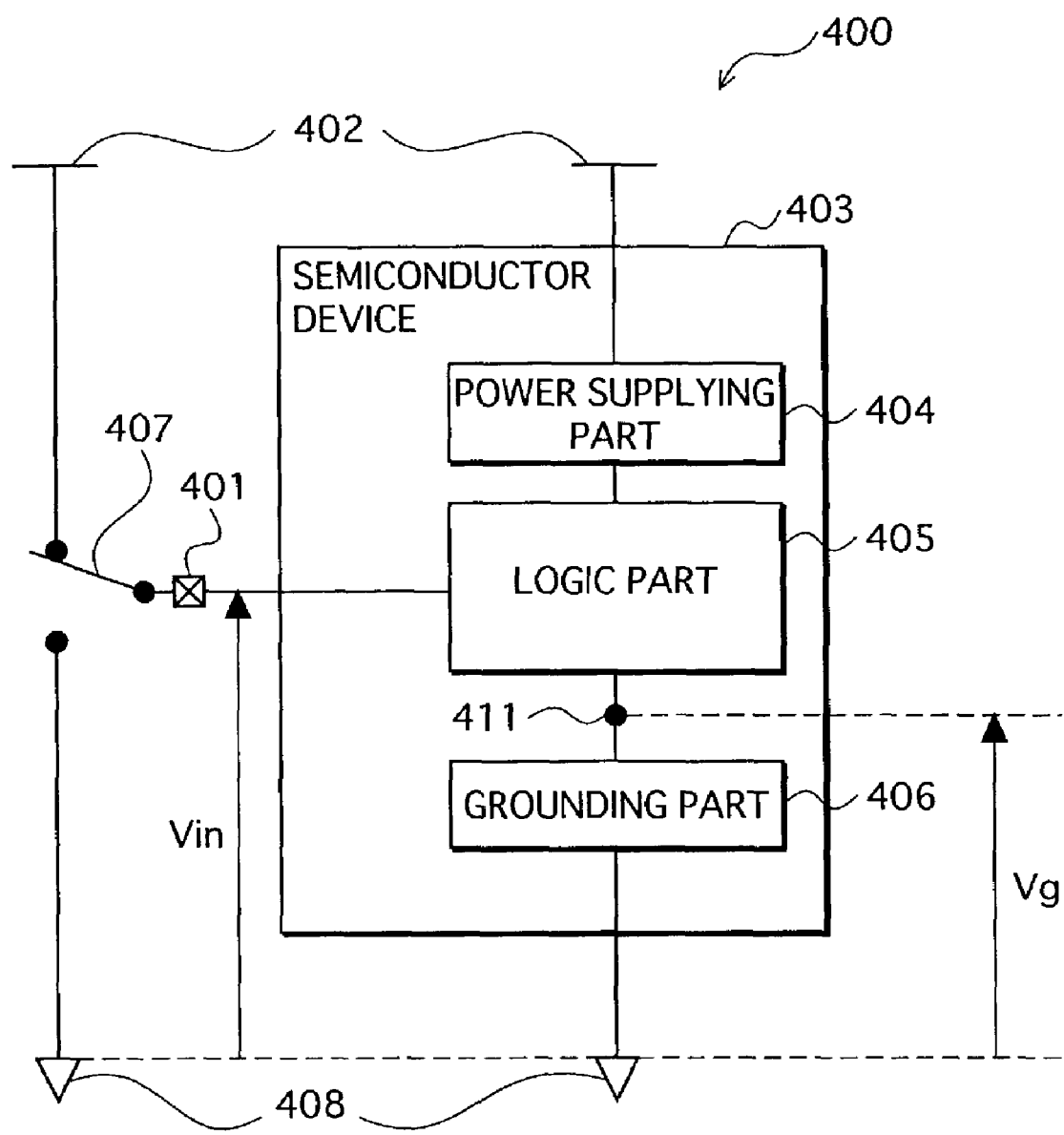
FIG. 4 is a block diagram showing a construction of a semiconductor device which is subjected to evaluation in the second embodiment of the invention.

FIG. 4 shows a construction of a semiconductor device and a reference voltage at its input terminal.

In the drawing, a semiconductor device 403 is roughly made up of a power supplying part 404, a logic part 405, and a grounding part 406. The power supplying part 404 includes a power terminal and power wiring. The logic part 405 includes logic circuits. The grounding part 406 includes a ground terminal and ground wiring. The logic part 405 has an input terminal 401 for acquiring an external signal. Operating power is supplied from a power supply 402. The input terminal 401 is connected to the power supply 402 or a ground 408, via voltage selection means such as a switch 407. In this way, input voltage Vin at the input terminal 401 is set.

In more detail, an external signal which takes the ground 408 as a reference voltage is input in the input terminal 401. The logic part 405 judges the logic of the external signal with reference to a voltage of a node 411. This being so, if the voltage difference between the ground 408 and the node 411, i.e. voltage Vg arising in the grounding part 406 due to the noise, exceeds a maximum tolerance, there is a danger that the logic part 405 may not be able to correctly judge the logic of the external signal.

Accordingly, if the voltage arising in the grounding part equivalent circuit 106 due to the noise exceeds the maximum tolerance in the equivalent circuit 100, it is judged that the logic part 405 in the semiconductor device 403 may fail to correctly judge the logic of an external signal, which would cause a malfunction.

Here, the maximum tolerance above which the possibility of malfunction arises has been set beforehand, for the absolute value of the voltage which arises in the grounding part equivalent circuit 106 due to the noise.

(Noise Immunity Evaluation Method)

The execution of the noise immunity evaluation method of the second embodiment by the noise immunity evaluation apparatus 200 (FIG. 2) is described below. The operation performed by the noise immunity evaluation apparatus 200 here differs from that of the first embodiment (FIG. 3) as follows.

The acquiring unit 201 acquires the impedances of the components of the equivalent circuit 100. The acquiring unit 201 also acquires the current generated by the noise source equivalent circuit 101, and the maximum tolerance of the absolute value of the voltage which arises in the grounding part equivalent circuit 106 due to the noise. The storing unit 202 stores the acquired impedances, current, and maximum tolerance.

The calculating unit 203 assigns impedances Z0, Zv, Zl, and Zg and current I stored in the storing unit 202 to Equation 4, to find voltage Vg which arises in the grounding part equivalent circuit 106:

$$Vg = K \cdot I \cdot Zg \quad \text{(Equation 4)}$$
$$= \frac{Z0 \cdot Zg}{Zv + Zl + Zg + Z0} \cdot I$$

The evaluating unit 204 compares the absolute value of voltage Vg with the maximum tolerance stored in the storing unit 202. If the absolute value of voltage Vg is greater than the maximum tolerance, the evaluating unit 204 judges the noise immunity of the semiconductor device as being poor. Otherwise, the evaluating unit 204 judges the noise immunity of the semiconductor device as being favorable. The outputting unit 205 outputs the evaluation result.

CONCLUSION

According to the noise immunity evaluation method of the second embodiment, an actual circuit including a semiconductor device that is subjected to evaluation is represented by an equivalent circuit which includes a target equivalent circuit representing the semiconductor device, a noise source equivalent circuit representing a noise source outside the semiconductor device, and an external equivalent circuit representing a circuit outside the semiconductor device. This being so, voltage Vg which arises in a grounding part equivalent circuit in the target equivalent circuit is calculated, and the absolute value of voltage Vg is compared with a predetermined maximum tolerance. In this way, the immunity of the semiconductor device against extraneous noise can be evaluated in consideration of the effects of circuitry outside the semiconductor device.

As an alternative, the noise immunity may be evaluated by calculating a current flowing through the target equivalent circuit 103 and comparing the absolute value of the current with its maximum tolerance above which the possibility of malfunction arises. Since voltage Vg can be obtained by multiplying this current by impedance Zg, this method is substantially the same as that of the second embodiment.

Also, the noise generated by the noise source equivalent circuit 101 may be expressed by a voltage.

The noise immunity may also be evaluated by calculating a voltage arising in the power supplying part equivalent circuit 104 due to the noise and comparing the absolute value of the voltage with its maximum tolerance. If the logic part 405 in the actual semiconductor device judges the logic of an external signal with reference to the voltage at the connection point with the power supplying part 404, the voltage arising in the power supplying part equivalent circuit 104 in the equivalent circuit 100 may be used to judge the possibility of malfunction. In such a case, the noise immunity can be evaluated using the voltage arising in the power supplying part equivalent circuit 104, in the same way as the voltage arising in the grounding part equivalent circuit 106.

According to the second embodiment, the impedances of the circuit components and the noise current are assigned to the algebraic equation expressing the equivalent circuit. Accordingly, a solution can be obtained in the case where the noise is a direct current. Also, a sine-wave stationary solution can be obtained in the case where the noise is an alternating current. As an alternative, the equivalent circuit may be expressed by a differential equation to obtain a transient response, or a circuit simulation may be performed based on numerical computation to directly obtain a numerical solution.

Third Embodiment

The following describes a method and apparatus for evaluating noise immunity of a semiconductor device in the third embodiment of the present invention, by referring to drawings.

In the third embodiment, an actual circuit including a semiconductor device that is subjected to evaluation is represented by an equivalent circuit which includes a target equivalent circuit representing the semiconductor device and a noise source equivalent circuit representing a noise source outside the semiconductor device, as in the first embodiment. However, the third embodiment differs from the first embodiment in that a logic part equivalent circuit in the target equivalent circuit is divided into smaller units, to reflect a complex inner construction of the semiconductor device.

The difference with the first embodiment is described in detail below.

(Evaluation Principle)

The principle of noise immunity evaluation of the third embodiment is given below, based on a construction of a semiconductor device that is subjected to the evaluation.

Figure 5:
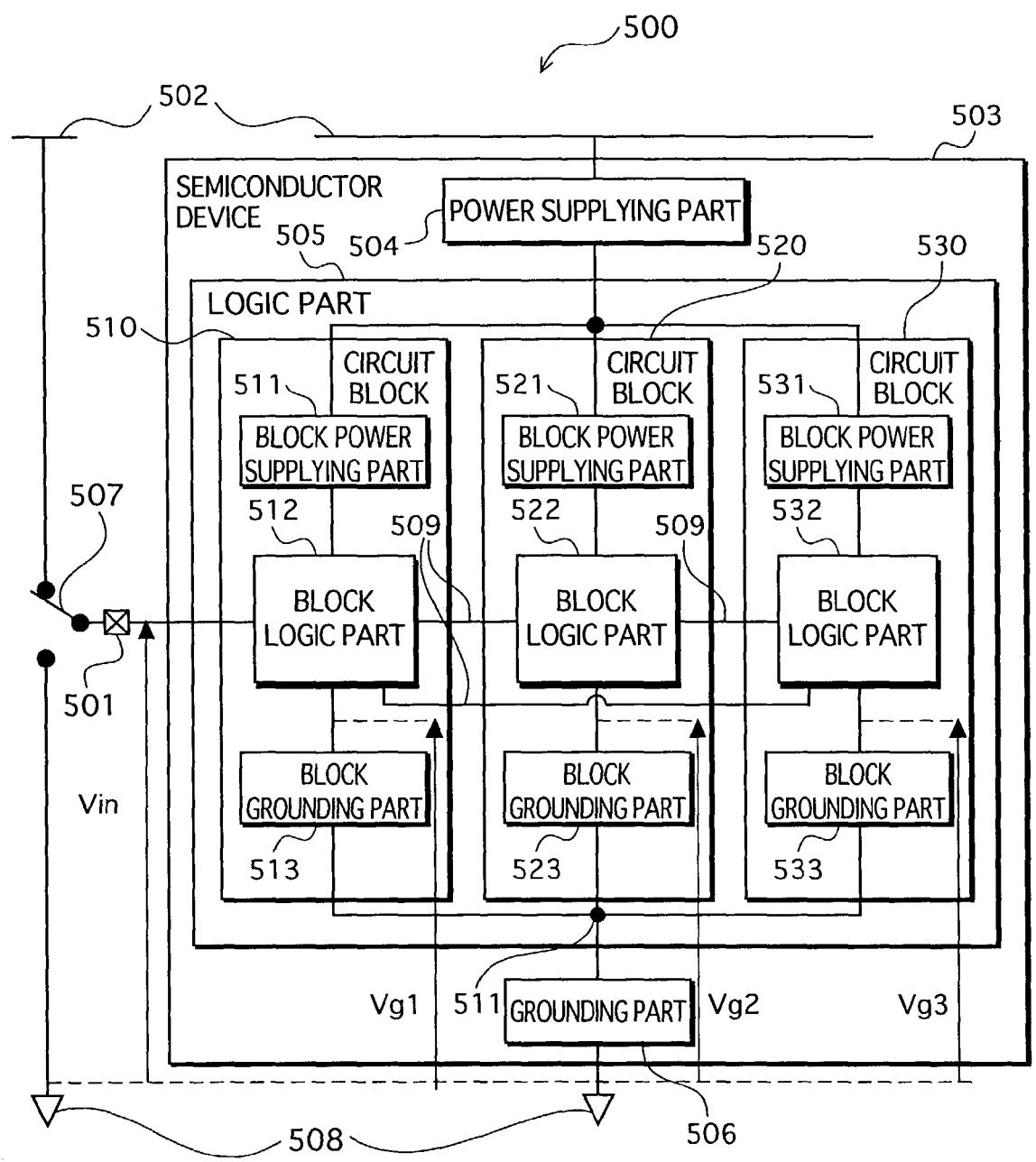
FIG. 5 is a block diagram showing a construction of a semiconductor device which is subjected to evaluation in the third embodiment of the invention.

FIG. 5 shows a construction of a semiconductor device and a reference voltage at its input terminal.

As illustrated, a semiconductor device 503 is roughly made up of a power supplying part 504, a logic part 505, and a grounding part 506. The power supplying part 504 includes power pins, leads, and bonding wires in a package, and power wiring before branching into circuit blocks. The logic part 505 includes logic circuits. The grounding part 506 includes ground pins, leads, and bonding wires in the package, and ground wiring common to the circuit blocks.

The logic part 505 includes circuit blocks 510, 520, and 530 corresponding to different functions. The circuit blocks 510, 520, and 530 are connected in parallel. The circuit block 510 includes a block power supplying part 511, a block logic part 512, and a block grounding part 513 which are connected in series. The block power supplying part 511 includes power wiring in the circuit block 510. The block logic part 512 includes logic circuits. The block grounding part 513 includes ground wiring in the circuit block 510.

The block logic part 512 has an input terminal 501 for acquiring an external signal. Operating power is given from a power supply 502. The input terminal 501 is connected to the power supply 502 or a ground 508, via voltage selection means such as a switch 507. In this way, input voltage Vin at the input terminal 501 is set.

The block logic part 512 is connected to block logic parts 522 and 532 through signal wiring 509, and exchanges communication signals with them.

The circuit blocks 520 and 530 have the same construction as the circuit block 510.

As explained in the first and second embodiments, a malfunction in the semiconductor device 503 may occur in any of the following two cases. First, a voltage arising in any of the block logic parts 512, 522, and 532 due to the noise causes the on/off state of a transistor in that block logic part to change unexpectedly. Second, a voltage arising between the grounding part 506 and any of the block grounding parts 513, 523, and 533 due to the noise causes the corresponding block logic part to fail to correctly judge the logic of an external signal.

In addition, a malfunction in the semiconductor device 503 may occur in the following case. A difference in voltage between any two block grounding parts out of the block grounding parts 513, 523, and 533 is a difference in reference voltage between the corresponding two block logic parts. This being the case, if the difference in voltage between the two block grounding parts exceeds a predetermined level, the corresponding two block logic parts may fail to correctly judge the logic of a communication signal, which would incur a malfunction.

Furthermore, a malfunction in the semiconductor device 503 may occur when a difference in voltage between any two block logic parts out of the block logic parts 512, 522, and 532 exceeds a predetermined level.

(Equivalent Circuit)

Figure 6:
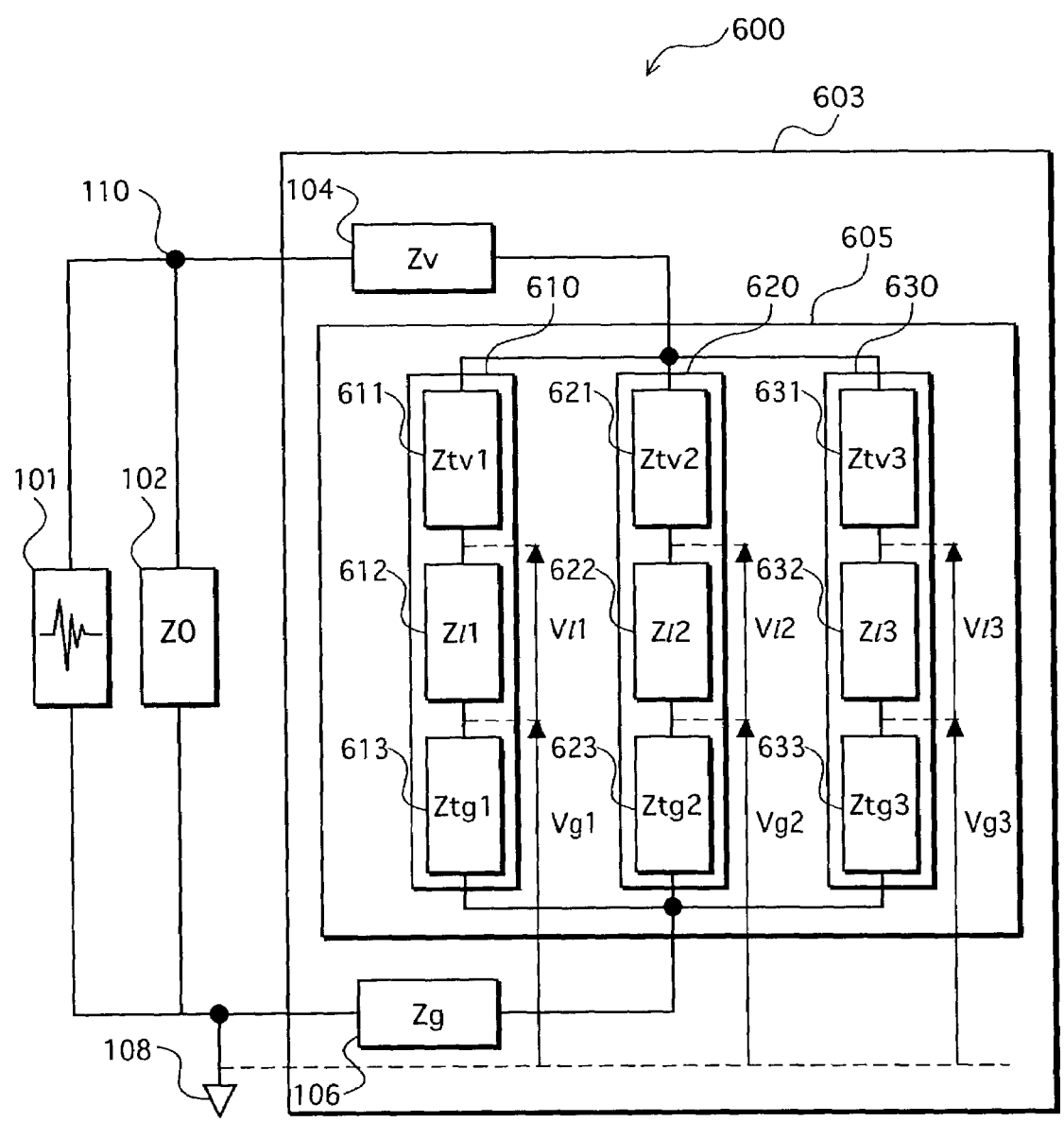
FIG. 6 shows an equivalent circuit representing an actual circuit in the third embodiment.

FIG. 6 shows an equivalent circuit representing an actual circuit including the semiconductor device 503.

In the drawing, an equivalent circuit 600 has a construction in which the logic part equivalent circuit 105 of the equivalent circuit 100 shown in FIG. 1 has been replaced with a logic part equivalent circuit 605. The logic part equivalent circuit 605 is made up of block equivalent circuit 610, 620, and 630 which are connected in parallel. The block equivalent circuits 610, 620, and 630 correspond to the circuit blocks 510, 520, and 530 of the semiconductor device 503.

The block equivalent circuit 610 includes a block power supplying part equivalent circuit 611, a block logic part equivalent circuit 612, and a block grounding part equivalent circuit 613 which are connected in series. The block power supplying part equivalent circuit 611 represents the block power supplying part 511 of the circuit block 510. The block logic part equivalent circuit 612 represents the block logic part 512 in the circuit block 510. The block grounding part equivalent circuit 613 represents the block grounding part 513 in the circuit block 510. The block equivalent circuits 620 and 630 have the same construction as the block equivalent circuit 610.

Also, voltages arising in the block logic part equivalent circuits 612, 622, and 632 are denoted by Vl1, Vl2, and Vl3 respectively, and voltages arising between the grounding part equivalent circuit 106 and the block grounding part equivalent circuits 613, 623, and 633 are denoted by Vg1, Vg2, and Vg3 respectively.

In this embodiment, a maximum tolerance above which the possibility of malfunction arises has been set beforehand for the absolute value of each of voltages Vg1, Vg2, and Vg3. Also, a maximum tolerance has been set for the difference of any two voltages out of voltages Vg1, Vg2, and Vg3. Also, a maximum tolerance has been set for the absolute value of each of voltages Vl1, Vl2, and Vl3. Furthermore, a maximum tolerance has been set for the difference of any two voltages out of voltages Vl1, Vl2, and Vl3.

(Noise Immunity Evaluation Method)

The execution of the noise immunity evaluation method of the third embodiment by the noise immunity evaluation apparatus 200 (FIG. 2) is explained below. The operation performed by the noise immunity evaluation apparatus 200 here is different from that of the first embodiment (FIG. 3) as follows.

The acquiring unit 201 acquires the impedance of the external equivalent circuit 102, and the impedances of the components of the target equivalent circuit 603. The acquiring unit 201 also acquires the current generated by the noise source equivalent circuit 101 and the above maximum tolerances. The storing unit 202 stores the acquired impedances, current, and maximum tolerances.

The calculating unit 203 calculates voltages Vl1, Vl2, Vl3, Vg1, Vg2, and Vg3, using a well-known method of assigning the impedances and current stored in the storing unit 202 to a circuit equation expressing the equivalent circuit 600.

The evaluating unit 204 judges whether any of the absolute values of voltages Vl1, Vl2, and Vl3 is greater than the corresponding maximum tolerance stored in the storing unit 202. The evaluating unit 204 also judges whether the difference of any two of the absolute values of voltages Vl1, Vl2, and Vl3 is greater than the corresponding maximum tolerance stored in the storing unit 202. The evaluating unit 204 also judges whether any of the absolute values of voltages Vg1, Vg2, and Vg3 is greater than the corresponding maximum tolerance stored in the storing unit 202. The evaluating unit 204 also judges whether the difference of any two of the absolute values of voltages Vg1, Vg2, and Vg3 is greater than the corresponding maximum tolerance stored in the storing unit 202. If any of the above judgements is in the affirmative, the evaluating unit 204 judges the noise immunity of the semiconductor device as being poor. If all of the judgements are in the negative, on the other hand, the evaluating unit 204 judges the noise immunity of the semiconductor device as being favorable. The outputting unit 205 outputs the evaluation result.

CONCLUSION

According to the noise immunity evaluation method of the third embodiment, a voltage that arises in each block equivalent circuit due to noise is calculated in an equivalent circuit representing an actual circuit including a semiconductor device. The possibility of malfunction occurring in individual circuit blocks of the semiconductor device is evaluated according to the absolute values of these voltages, whilst the possibility of malfunction occurring in relation to any two of the circuit blocks is evaluated according to the difference of the absolute values of these voltages. In so doing, the immunity of the semiconductor device against extraneous noise can be evaluated in consideration of the relations between the circuit blocks. Also, the equivalent circuit used here includes an external equivalent circuit, so that the effects of circuitry outside the semiconductor device can be taken into account, too.

As an alternative, the noise immunity may be evaluated by calculating a current flowing through each block equivalent circuit and comparing the absolute value of the current with its maximum tolerance above which the possibility of malfunction arises. This method is substantially the same as that of the third embodiment.

Also, the noise generated by the noise source equivalent circuit 101 may be expressed by a voltage.

The noise immunity may also be evaluated based on a voltage which arises between the power supplying part equivalent circuit 104 and each of the block power supplying part equivalent circuits 611, 621, and 631 due to the noise. If each block logic part in the actual semiconductor device judges the logic of an external signal with reference to the voltage at the connection point with the corresponding block power supplying part, the voltage arising between the power supplying part equivalent circuit 104 and each of the block power supplying part equivalent circuits 611, 621, and 631 can be used to judge the possibility of malfunction. In such a case, the noise immunity may be evaluated using the voltage between the power supplying part equivalent circuit 104 and each of the block power supplying part equivalent circuits 611, 621, and 631.

Also, the noise immunity may be evaluated based on a phase difference between any two voltages out of voltages Vg1, Vg2, and Vg3. Even when the absolute values of the two voltages are equal, a current arises between the corresponding block logic part equivalent circuits if the two voltages have a phase difference. This may cause a malfunction.

Also, the noise immunity may be evaluated based on a phase difference between any two voltages out of voltages Vl1, Vl2, and Vl3. Furthermore, the noise immunity may be evaluated based on a phase difference between any two voltages out of three voltages which arise in the block power supplying part equivalent circuits 611, 621, and 631.

According to the third embodiment, the impedances of the circuit components and the noise current are assigned to the algebraic equation expressing the equivalent circuit. Accordingly, a solution can be obtained in the case where the noise is a direct current. Also, a sine-wave stationary solution can be obtained in the case where the noise is an alternating current. Alternatively, the equivalent circuit may be expressed by a differential equation to obtain a transient response, or a circuit simulation may be performed based on numerical computation to directly obtain a numerical solution.

Fourth Embodiment

The following describes a method and apparatus for evaluating noise immunity of a semiconductor device in the fourth embodiment of the present invention, by referring to drawings.

In the fourth embodiment, an actual circuit including a semiconductor device which is subjected to evaluation is represented by an equivalent circuit that includes a target equivalent circuit representing the semiconductor device and a plurality of noise source equivalent circuits representing a plurality of noise sources outside the semiconductor device.

(Equivalent Circuit)

Figure 7:
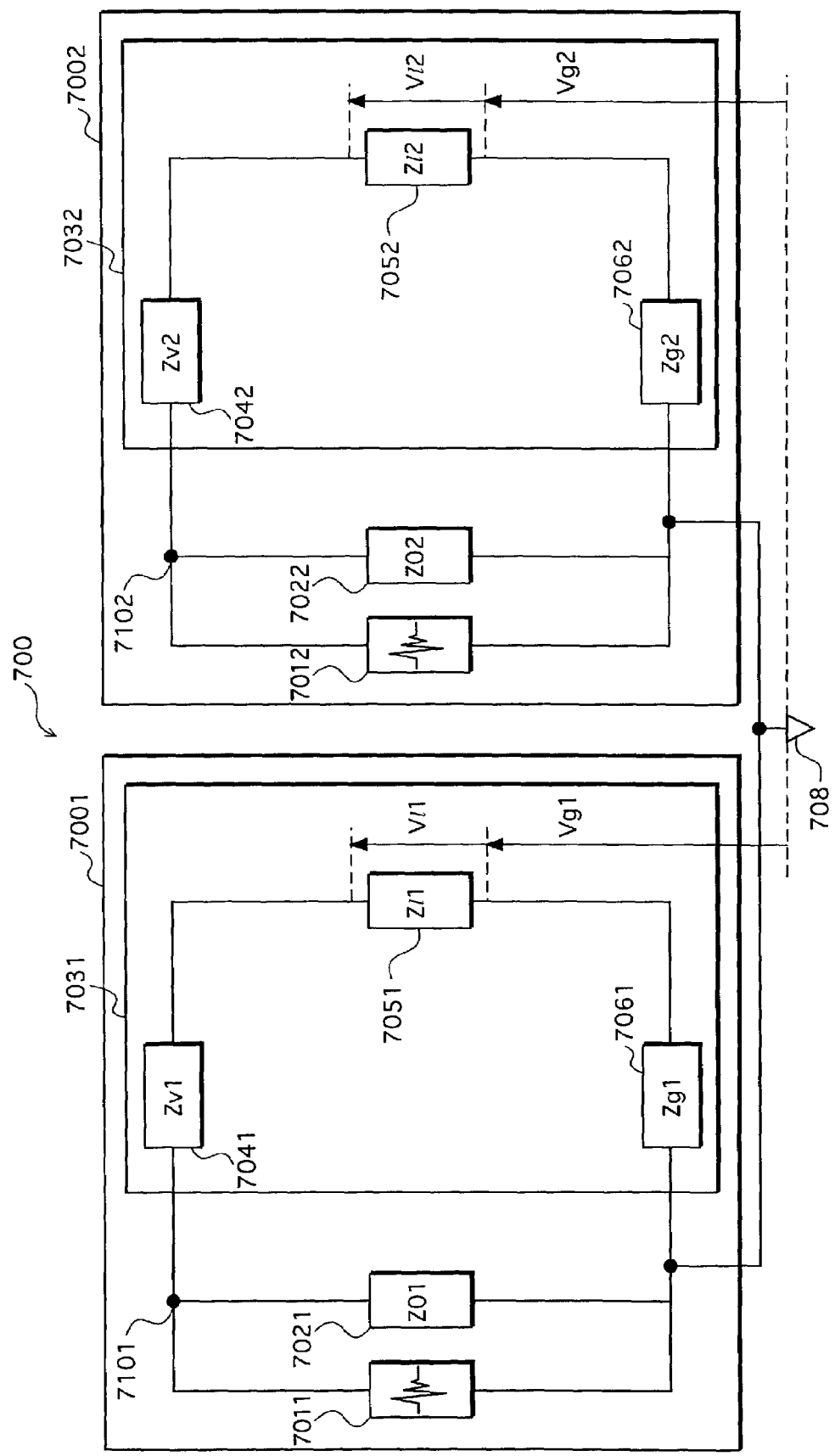
FIG. 7 shows an equivalent circuit representing an actual circuit in the fourth embodiment of the invention.

FIG. 7 shows an equivalent circuit representing an actual circuit in the fourth embodiment. Here, a semiconductor device which is to be evaluated includes a plurality of circuit blocks that are each influenced by a different one of a plurality of noise sources.

In the drawing, an equivalent circuit 700 includes partial equivalent circuits 7001 and 7002 which are connected to a common ground 708. The partial equivalent circuits 7001 and 7002 are in a one-to-one correspondence with the circuit blocks of the semiconductor device.

The partial equivalent circuit 7001 has a noise source equivalent circuit 7011, a block equivalent circuit 7031, and an external equivalent circuit 7021 which are connected in parallel. The noise source equivalent circuit 7011 represents a noise source which influences a circuit block represented by the block equivalent circuit 7031. The block equivalent circuit 7031 represents the circuit block. The external equivalent circuit 7021 represents a circuit outside the semiconductor device. The partial equivalent circuit 7002 is constructed in the same way as the partial equivalent circuit 7001.

The block equivalent circuit 7031 has a block power supplying part equivalent circuit 7041, a block logic part equivalent circuit 7051, and a block grounding part equivalent circuit 7061 which are connected in series. The block power supplying part equivalent circuit 7041 represents a power supplying part of the circuit block, including power wiring. The block logic part equivalent circuit 7051 represents a logic part of the circuit block, including logic circuits. The block grounding part equivalent circuit 7061 represents a grounding part of the circuit block, including ground wiring. A block equivalent circuit 7032 in the partial equivalent circuit 7002 is constructed in the same way as the block equivalent circuit 7031.

Voltages arising in the block logic part equivalent circuits 7051 and 7052 are respectively denoted by Vl1 and Vl2, whereas voltages arising in the block grounding part equivalent circuits 7061 and 7062 are respectively denoted by Vg1 and Vg2.

(Evaluation Principle)

The principle of noise immunity evaluation in the fourth embodiment is the same as that of the third embodiment. Which is to say, if the absolute value of any of voltage Vl1 and Vl2 exceeds its maximum tolerance, the noise immunity is judged as being poor. Also, if the difference of the absolute values of voltages Vl1 and Vl2 exceeds its maximum tolerance, the noise immunity is judged as being poor. Also, if the absolute value of any of voltages Vg1 and Vg2 exceeds its maximum tolerance, the noise immunity is judged as being poor. Also, if the difference of the absolute values of voltages Vg1 and Vg2 exceeds its maximum tolerance, the noise immunity is judged as being poor.

In addition, the noise immunity may be evaluated based on the phase difference of voltages Vl1 and Vl2 and the phase difference of voltages Vg1 and Vg2. Furthermore, the noise immunity may be evaluated based on a voltage or current arising in each of the block power supplying part equivalent circuits 7041 and 7042.

(Noise Immunity Evaluation Method)

The execution of the noise immunity evaluation method of the fourth embodiment by the noise immunity evaluation apparatus 200 (FIG. 2) is explained below. The operation performed by the noise immunity evaluation apparatus 200 here is different from that of the first embodiment (FIG. 3) as follows.

The acquiring unit 201 acquires the impedances of the external equivalent circuits 7021 and 7022, the impedances of the components of the block equivalent circuits 7031 and 7032, and the currents generated by the noise source equivalent circuits 7011 and 7012. The acquiring unit 201 also acquires the maximum tolerance of the absolute value of voltage Vl1, the maximum tolerance of the absolute value of -voltage Vl2, and the maximum tolerance of the difference between the absolute values of voltages Vl1 and Vl2. The acquiring unit 201 further acquires the maximum tolerance of the absolute value of voltage Vg1, the maximum tolerance of the absolute value of voltage Vg2, and the maximum tolerance of the difference between the absolute values of voltages Vg1 and Vg2. The storing unit 202 stores the acquired impedances, currents, and maximum tolerances.

The calculating unit 203 calculates voltages Vl1, Vl2, Vg1, and Vg2, using a well-known method of assigning the impedances and currents stored in the storing unit 202 to a circuit equation that expresses the equivalent circuit 700.

The evaluating unit 204 judges whether any of the absolute values of voltages Vl1 and Vl2 is greater than the corresponding maximum tolerance stored in the storing unit 202. The evaluating unit 204 also judges whether the difference between the absolute values of voltages Vl1 and Vl2 is greater than the corresponding maximum tolerance stored in the storing unit 202. The evaluating unit 204 also judges whether any of the absolute values of voltages Vg1 and Vg2 is greater than the corresponding maximum tolerance stored in the storing unit 202. The evaluating unit 204 also judges whether the difference between the absolute values of voltages Vg1 and Vg2 is greater than the corresponding maximum tolerance stored in the storing unit 202. If any of the above judgements is in the affirmative, the evaluating unit 204 judges the noise immunity of the semiconductor device as being poor. Otherwise, the evaluating unit 204 judges the noise immunity of the semiconductor device as being favorable. The outputting unit 205 outputs the evaluation result.

CONCLUSION

According to the noise immunity evaluation method of the fourth embodiment, a voltage which arises in each block equivalent circuit due to different noise is calculated in an equivalent circuit representing an actual circuit including a semiconductor device. The possibility of malfunction occurring in individual circuit blocks of the semiconductor device is evaluated according to the absolute values of these voltages, whilst the possibility of malfunction occurring in relation to any two of the circuit blocks is evaluated according to the difference of the absolute values of the voltages. In so doing, the immunity of the semiconductor device against a plurality of extraneous noise sources can be evaluated. Also, since the equivalent circuit used here includes an external equivalent circuit, the effects of circuitry outside the semiconductor device can be taken into account.

This method is particularly suitable for a semiconductor device which receives power from a plurality of power supply systems that each cause separate extraneous noise.

As an alternative, the noise immunity may be evaluated by calculating a current flowing through each block equivalent circuit and comparing the absolute value of the current with its maximum tolerance above which the possibility of malfunction arises. This method is substantially the same as that of the fourth embodiment.

Also, the noise generated by each of the noise source equivalent circuits 7011 and 7012 may be expressed by a voltage.

The noise immunity may also be evaluated based on a voltage which arises in each of the block power supplying part equivalent circuits 7041 and 7042 due to corresponding noise. If each block logic part in the actual semiconductor device judges the logic of an external signal with reference to the voltage at the connection point with the corresponding block power supplying part, the noise immunity can be evaluated using the voltage arising in each of the block power supplying part equivalent circuits 7041 and 7042. Here, the noise immunity may be evaluated based on the absolute values of the two voltages, the difference between the absolute values of the two voltages, and the phase difference between the two voltages.

Also, the noise immunity may be evaluated based on the phase difference between voltages Vl1 and Vl2 or the phase difference between voltages Vg1 and Vg2. Even when the absolute values of the two voltages are equal, a current arises between the corresponding block logic part equivalent circuits if the two voltages have a phase difference. This may cause a malfunction.

According to the fourth embodiment, the impedances of the circuit components and the noise currents are assigned to the algebraic equation expressing the equivalent circuit. Accordingly, a solution can be obtained in the case where the noise is a direct current. Also, a sine-wave stationary solution can be obtained in the case where the noise is an alternating current. As an alternative, the equivalent circuit may be expressed by a differential equation to obtain a transient response, or a circuit simulation may be performed based on numerical computation to directly obtain a numerical solution.

Fifth Embodiment

The following describes a method and apparatus for evaluating noise immunity of a semiconductor device in the fifth embodiment of the present invention, by referring to drawings.

In the fifth embodiment, an actual circuit including a semiconductor device that is subjected to evaluation is represented by an equivalent circuit which includes a target equivalent circuit representing the semiconductor device and a noise source equivalent circuit representing a noise source outside the semiconductor device, as in the first embodiment. However, the fifth embodiment differs with the first embodiment in that the equivalent circuit does not include an external equivalent circuit representing a circuit outside the semiconductor device.

The difference with the first embodiment is described in detail below.

(Equivalent Circuit)

Figure 8:
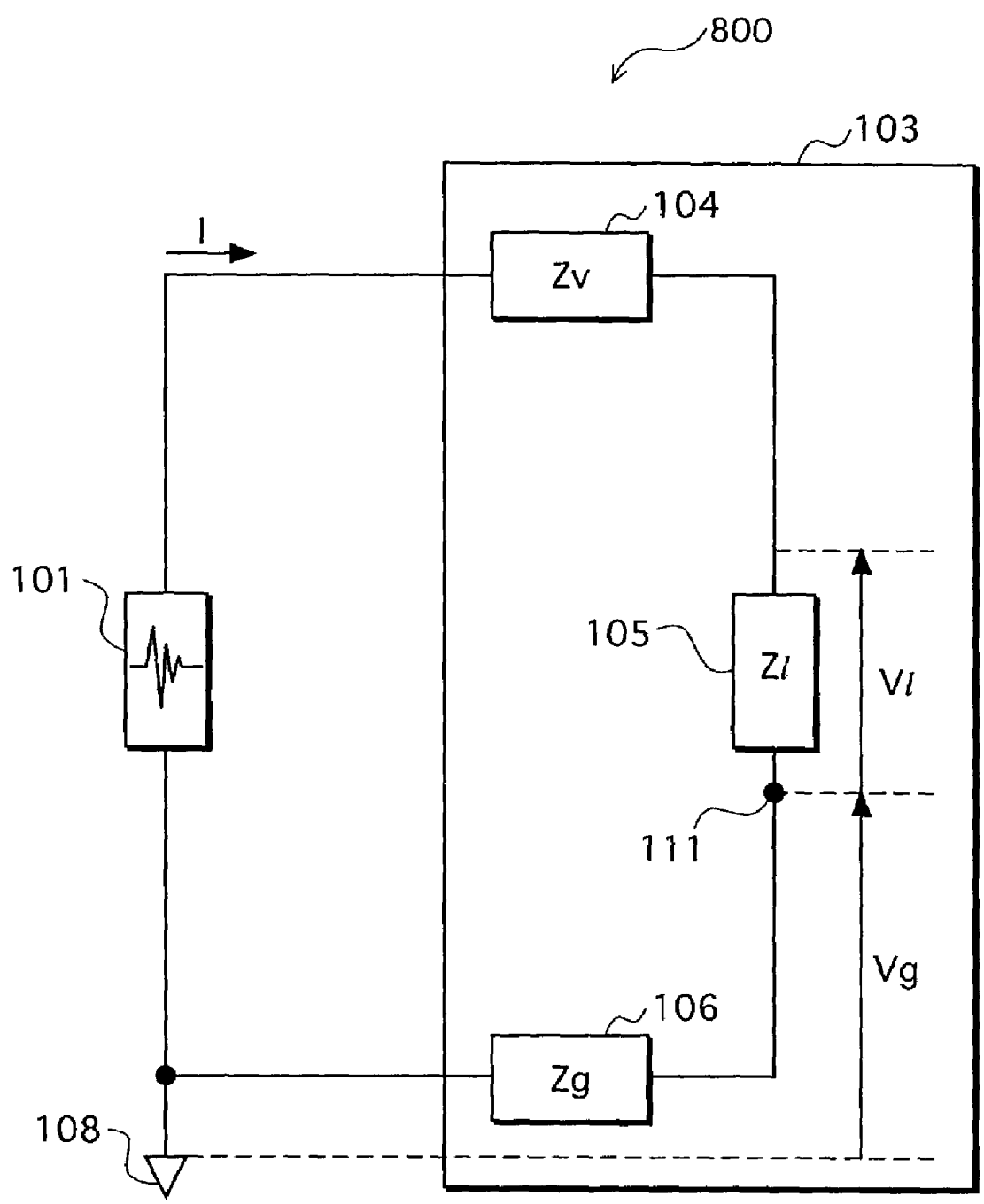
FIG. 8 shows an equivalent circuit representing an actual circuit in the fifth embodiment of the invention.

FIG. 8 shows an equivalent circuit representing an actual circuit in the fifth embodiment.

In the drawing, an equivalent circuit 800 has a construction in which the external equivalent circuit 102 has been omitted from the equivalent circuit 100 used in the first embodiment (FIG. 1).

(Noise Immunity Evaluation Method)

The execution of the noise immunity evaluation method of the fifth embodiment by the noise immunity evaluation apparatus 200 (FIG. 2) is explained below. The operation performed by the noise immunity evaluation apparatus 200 here is different from that of the first embodiment (FIG. 3) as follows.

The acquiring unit 201 acquires the impedances of the components of the target equivalent circuit 103 in the equivalent circuit 800. The acquiring unit 201 also acquires the current generated by the noise source equivalent circuit 101, and the maximum tolerance. The storing unit 202 stores the acquired impedances, current, and maximum tolerance.

The calculating unit 203 calculates voltages Vl and Vg, using a well-known method of assigning the impedances and current stored in the storing unit 202 to a circuit equation which expresses the equivalent circuit 800.

After this, the evaluating unit 204 evaluates the noise immunity of the semiconductor device based on the absolute values of voltages Vl and Vg, in the same way as in the first embodiment. The outputting unit 205 outputs the evaluation result.

CONCLUSION

According to the noise immunity evaluation method of the fifth embodiment, the whole noise generated by the noise source equivalent circuit 101 is fed into the target equivalent circuit 103. This method is particularly suitable when the effects of circuitry outside the semiconductor device are negligible.

Here, the noise immunity may instead be evaluated based on a current flowing through the target equivalent circuit 103. Also, the noise generated by the noise source equivalent circuit 101 may be expressed by a voltage.

Also, the equivalent circuit may be expressed by a differential equation to obtain a transient response, or a circuit simulation may be performed based on numerical computation to directly obtain a numerical solution.

The fifth embodiment describes the case where the external equivalent circuit 102 has been omitted from the equivalent circuit 100. In the same manner, the external equivalent circuit 102 may be omitted from the equivalent circuit 600. Also, the external equivalent circuits 7021 and 7022 may be omitted from the equivalent circuit 700.

Sixth Embodiment

The following describes a method of evaluating noise immunity of a semiconductor device in the sixth embodiment of the present invention, by referring to drawings.

In the sixth embodiment, specific values are set for the impedances and the noise current in the equivalent circuit 100 of the first embodiment (FIG. 1) This being so, a circuit simulation is performed based on numerical computation, to obtain the frequency characteristics of voltages Vl and Vg with respect to frequency fI of the noise current.

(Equivalent Circuit)

Figure 9:
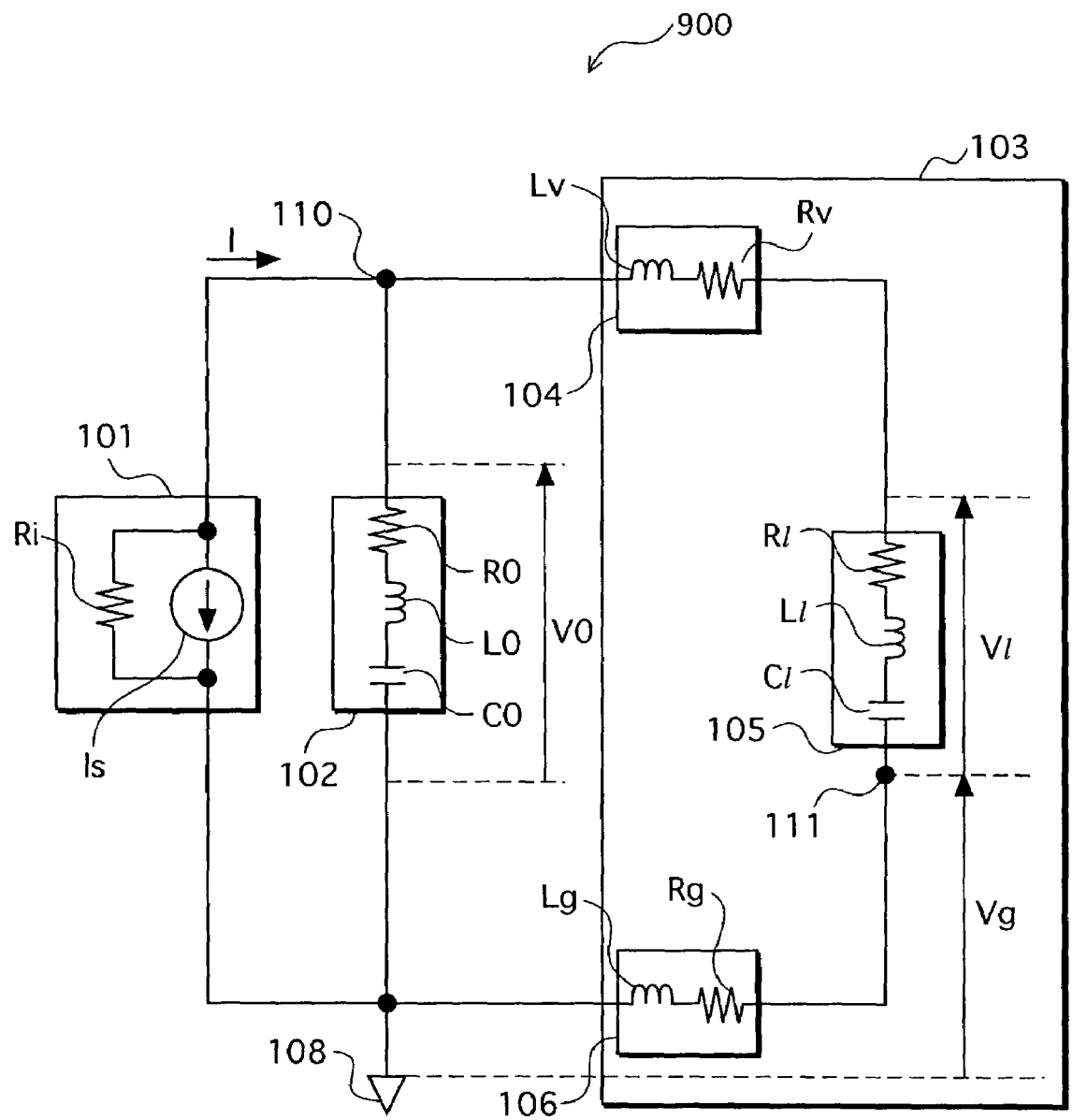
FIG. 9 shows a detailed equivalent circuit used in the sixth embodiment of the invention.

FIG. 9 shows a detailed equivalent circuit used in the sixth embodiment.

In the drawing, an equivalent circuit 900 is a circuit for specifying the impedance of each circuit included in the equivalent circuit 100. To do so, each circuit is shown in detail as follows.

The noise source equivalent circuit 101 has current source Is and a resistor with resistance Ri which are connected in parallel. The external equivalent circuit 102 has a resistor with resistance R0, an inductor with inductance L0, and a capacitor with capacitance C0 which are connected in series.

The power supplying part equivalent circuit 104 has a resistor with resistance Rv and an inductor with inductance Lv which are connected in series. The logic part equivalent circuit 105 has a resistor with resistance Rl, an inductor with inductance Ll, and a capacitor with capacitance Cl which are connected in series. The grounding part equivalent circuit 106 has a resistor with resistance Rg and an inductor with inductance Lg which are connected in series.

Also, a voltage arising in the external equivalent circuit 102 is denoted by V0, a voltage arising in the logic part equivalent circuit 105 is denoted by Vl, and a voltage arising in the grounding part equivalent circuit 106 is denoted by Vg.

The following settings are used as a first condition:

the amplitude of current source Is=1A;
resistance Ri=1 TΩ;
resistance R0=0.02Ω;
inductance L0=0.7 nH;
capacitance C0=0.1 µF;
inductance Lv=6 nH;
resistance Rv=1Ω;
resistance Rl=2Ω;
inductance Ll=2 nH;
capacitance Cl=10 pF;
resistance Rg=1Ω;
inductance Lg=6 nH; and
current I=1A.

Under the first condition, voltages V0, Vl, and Vg are calculated for frequency fI of current source Is, when frequency fI varies from 10 MHz to 1000 Mhz with predetermined intervals.

Figure 10A:
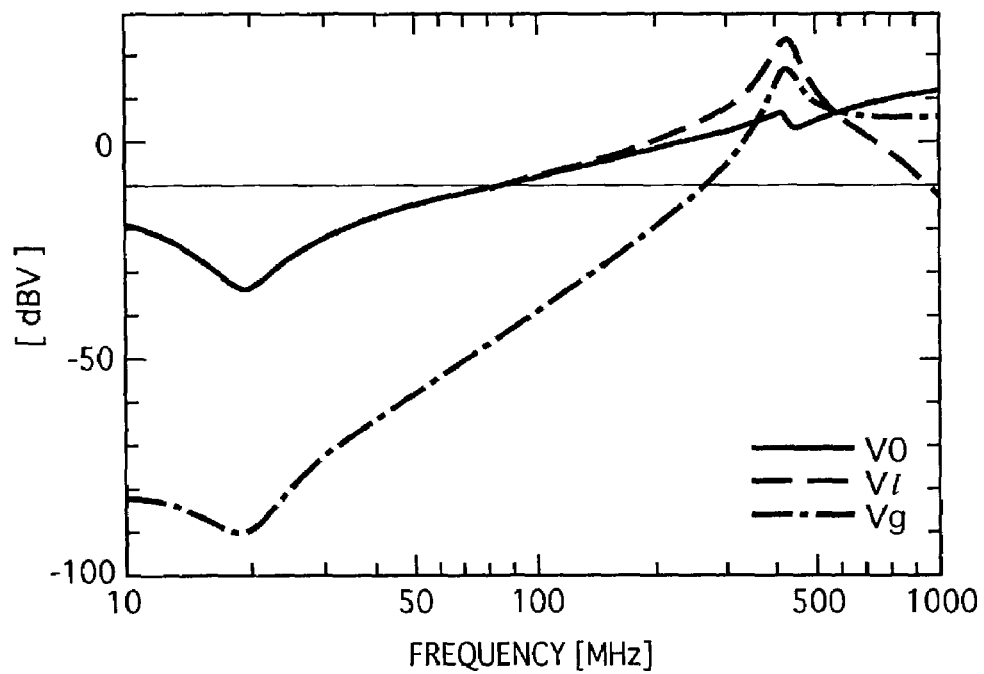
FIGS. 10A and 10B are graphs showing the frequency characteristics of voltages V0, Vl, and Vg.

FIG. 10A shows this calculation result plotted on a graph. In the graph, the horizontal axis shows frequency fI, whereas the vertical axis shows the absolute values of voltages V0, Vl, and Vg.

Also, a second condition is set such that capacitance Cl is 1000 pF and the other settings are the same as the first condition. Under the second condition, voltages V0, Vl, and Vg are calculated for frequency fI of current source Is, when frequency fI varies from 10 MHz to 1000 MHz with predetermined intervals.

Figure 10B:
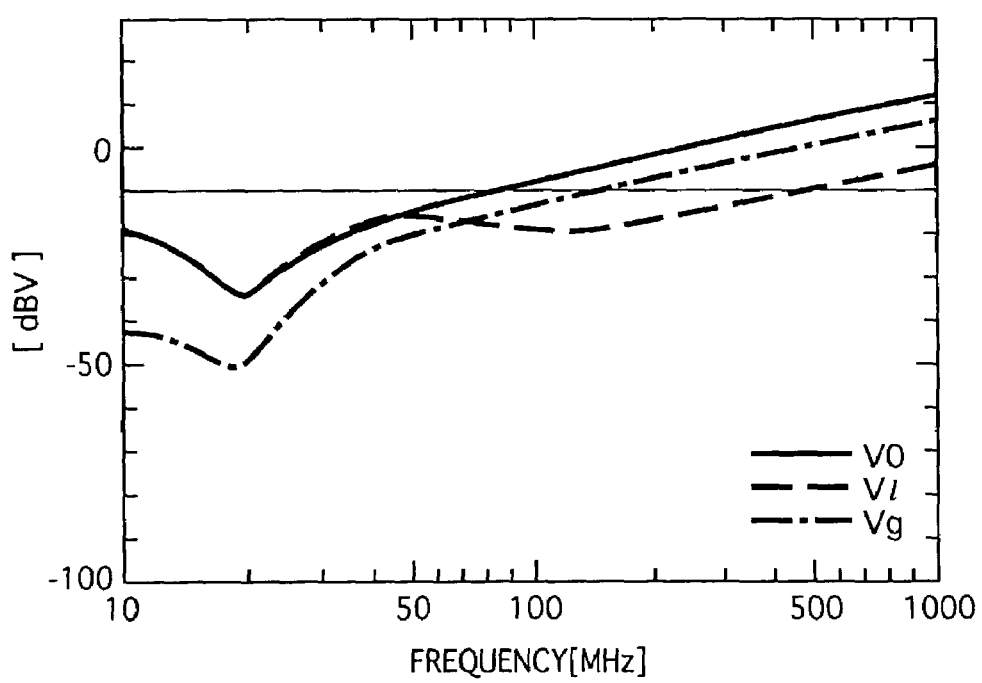

FIG. 10B shows this calculation result plotted on a graph. In the graph, the horizontal axis shows frequency fI, whereas the vertical axis shows the absolute values of voltages V0, Vl, and Vg.

Each of these graphs has MHz as the scale of the horizontal axis, and dBV as the scale of the vertical axis (1V=20). The absolute values of voltages V0, Vl, and Vg are designated by a solid line, a dashed line, and a one-dot chain line, respectively. The maximum tolerance of the absolute value of each voltage is set at −10 dBV.

Under the first condition (Cl=10 pF), the absolute value of voltage Vl exceeds the maximum tolerance when frequency fI is 70 MHz or more, and the absolute value of voltage Vg exceeds the maximum tolerance when frequency fI is 250 MHz or more.

Under the second condition (Cl=1000 pF), the absolute value of voltage Vl exceeds the maximum tolerance when frequency fI is 600 MHz or more, and the absolute value of voltage Vg exceeds the maximum tolerance when frequency fI is 200 MHz or more.

Accordingly, when capacitance Cl is 10 pF, the noise immunity of the semiconductor device is judged as being poor if frequency fI is 70 MHz or more. When capacitance Cl is 1000 pF, the noise immunity of the semiconductor device is judged as being poor if frequency fI is 200 MHz or more.

Also, if the difference between voltages V0 and Vg exceeds a predetermined level, the logic of an external signal input in the semiconductor device may not be able to be correctly judged, which may induce a malfunction. Accordingly, the noise immunity may be evaluated based on the difference between voltages V0 and Vg.

CONCLUSION

According to the noise immunity evaluation method of the sixth embodiment, the absolute values of voltages V0, V1, and Vg are calculated according to noise current frequency. This makes it possible to specify a range of noise current frequencies to which the immunity of the semiconductor device is poor.

If the same processing is performed by fixing the noise current frequency and instead varying the noise current amplitude, a range of noise current amplitudes to which the immunity of the semiconductor device is poor can be specified.

Also, if the same processing is performed by fixing the noise current frequency and amplitude and instead varying a specific impedance such as capacitance Cl, a range of values of such an impedance for attaining desired noise immunity can be determined.

Also, the noise source equivalent circuit 101 may instead have a voltage source and a resistor connected in series.

Seventh Embodiment

The following describes a method of evaluating noise immunity of a semiconductor device in the seventh embodiment of the present invention, by referring to drawings.

In the seventh embodiment, specific values are set for the impedances and the noise currents in the equivalent circuit 700 used in the fourth embodiment (FIG. 7). This being so, a circuit simulation is performed based on numerical analysis, to obtain the frequency characteristics of voltages Vl1 and Vl2 with respect to the frequencies of the corresponding noise currents.

(Equivalent Circuit)

Figure 11:
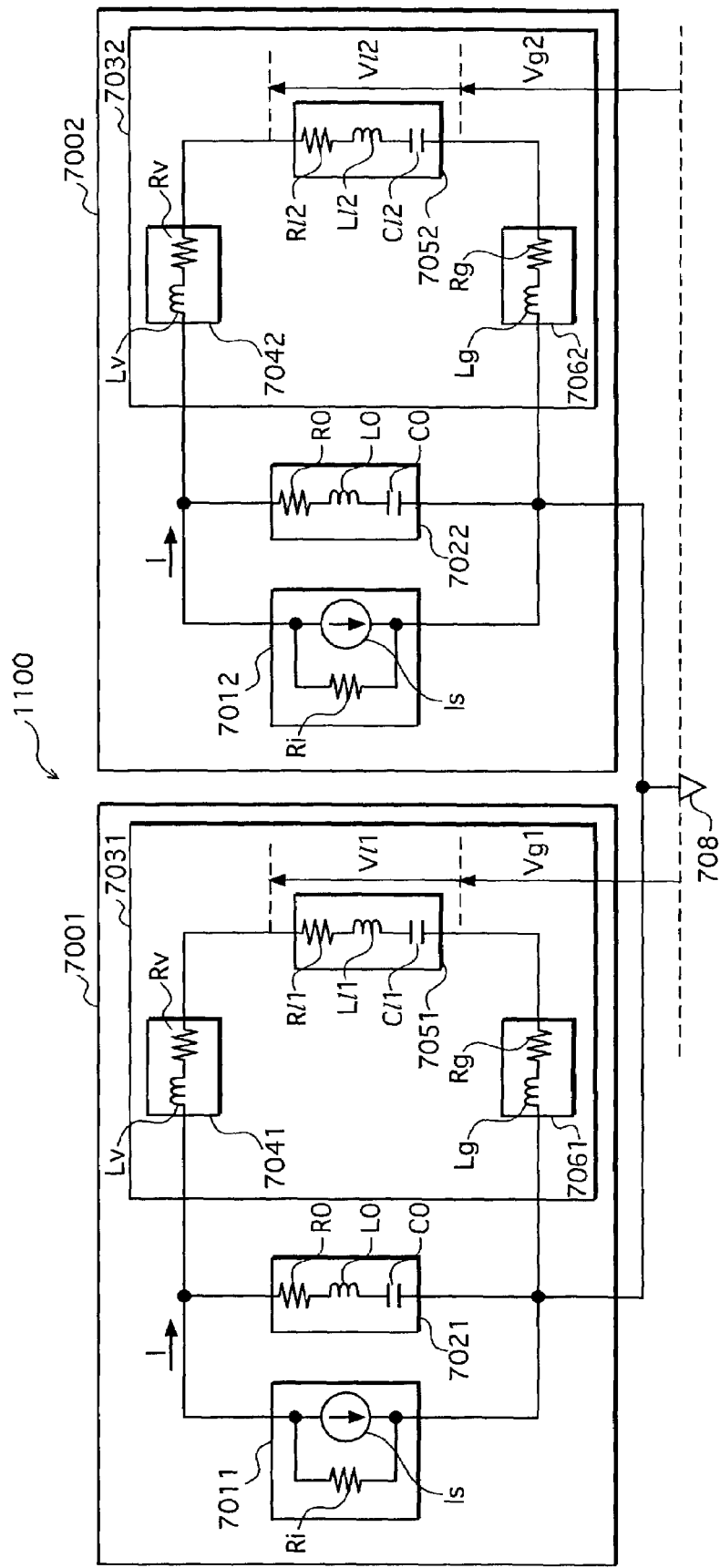
FIG. 11 shows a detailed equivalent circuit used in the seventh embodiment of the invention.

FIG. 11 shows an equivalent circuit used in the seventh embodiment.

In the drawing, an equivalent circuit 1100 is a circuit for specifying the impedance of each circuit included in the equivalent circuit 700. To do so, each circuit is detailed as follows.

The noise source equivalent circuits 7011 and 7012 each have current source Is and a resistor with resistance Ri connected in parallel. The external equivalent circuits 7021 and 7022 each have a resistor with resistance R0, an inductor with inductance L0, and a capacitor with capacitance C0 connected in series.

The block power supplying part equivalent circuits 7041 and 7042 each have a resistor with resistance Rv and an inductor with inductance Lv connected in series. The block logic part equivalent circuit 7051 has a resistor with resistance Rl1, an inductor with inductance Ll1, and a capacitor with capacitance Cl1 connected in series. The block logic part equivalent circuit 7052 has a resistor with resistance Rl2, an inductor with inductance Ll2, and a capacitor with capacitance Cl2 connected in series. The block grounding part equivalent circuits 7061 and 7062 each have a resistor with resistance Rg and an inductor with inductance Lg connected in series.

Also, voltages arising in the block logic part equivalent circuits 7051 and 7052 are denoted respectively by Vl1 and Vl2, whereas voltages arising in the block grounding part equivalent circuits 7061 and 7062 are denoted respectively by Vg1 and Vg2.

The following settings are used as an example condition:
the amplitude of current source Is=1A;
resistance Ri=1 TΩ;
resistance R0=0.02Ω;
inductance L0=0.7 nH;
capacitance C0=0.1 μF;
inductance Lv=6 nH;
resistance Rv=1Ω;
resistance Rl1=2Ω;
inductance Ll1=2 nH;
capacitance Cl1=10 pF;
resistance Rl2=2Ω;
inductance Ll2=2 nH;
capacitance Cl2=1000 pF;
resistance Rg=1Ω;
inductance Lg=6 nH; and
current I=1A.

Under this condition, the absolute values and phases of voltages Vl1 and Vl2 are calculated for frequency fI of current source Is, which varies from 10 MHz to 1000 MHz with predetermined intervals.

Figure 12:
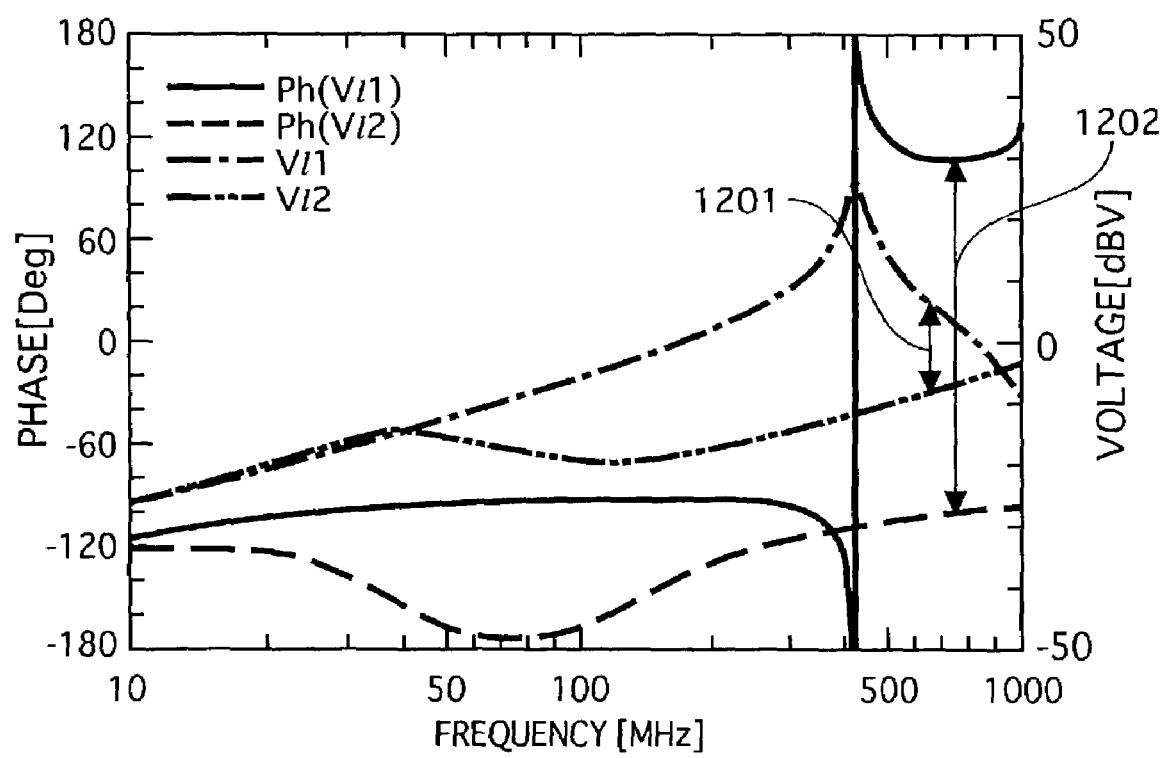
FIG. 12 is a graph showing the frequency characteristics of the absolute values and phases of voltages Vl1 and Vl2.
Figure 13:
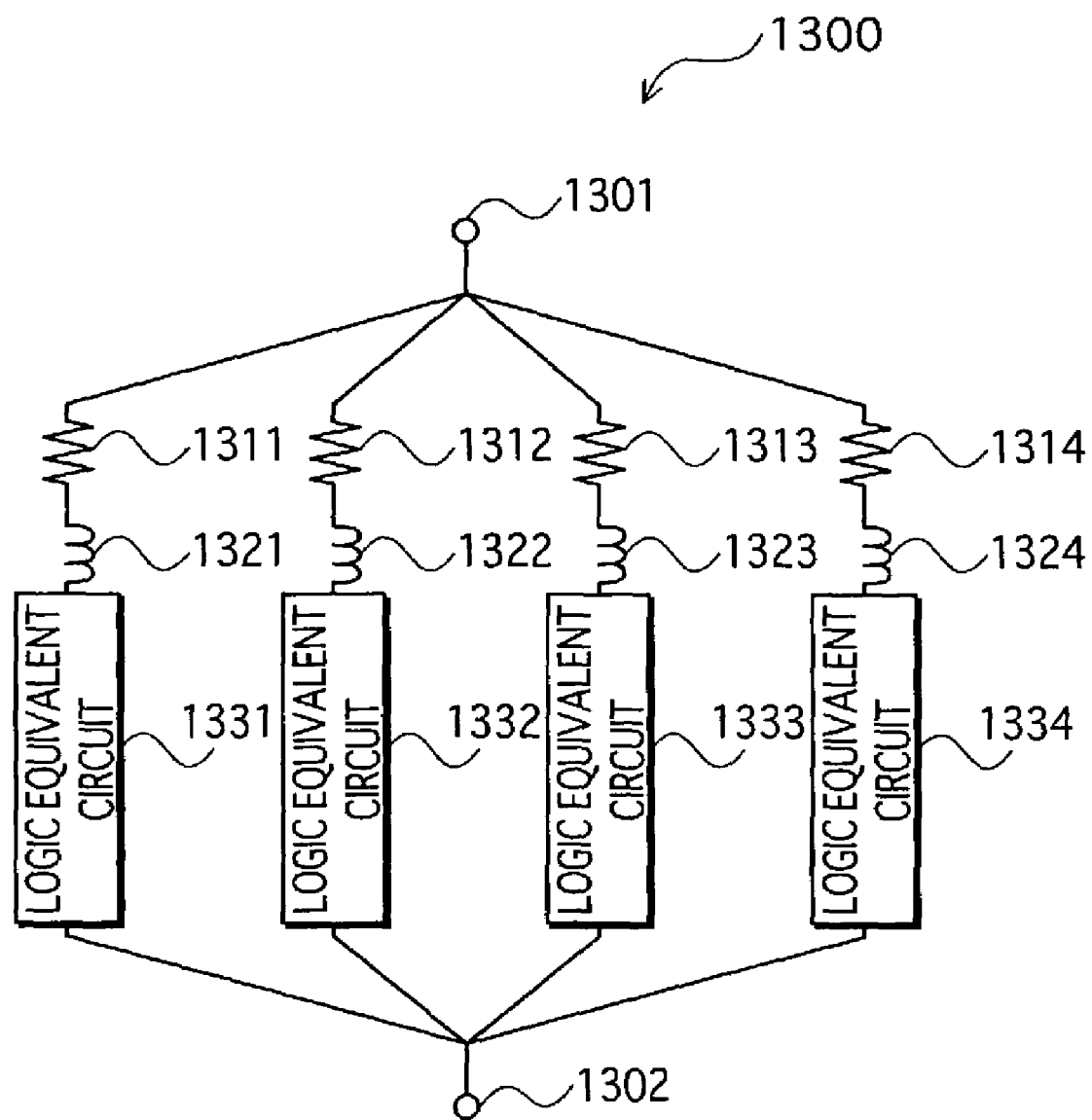
FIG. 13 shows an equivalent circuit representing a semiconductor device in a conventional method.

FIG. 12 shows this calculation result plotted on a graph. Here, the horizontal axis shows frequency fI, whilst the vertical axis shows the absolute values and phases of voltages Vl1 and Vl2.

This graph has MHz as the scale of the horizontal axis, degrees as a first scale of the vertical axis, and dBV as a second scale of the vertical axis (1V=20). The phases of voltages Vl1 an Vl2 are designated by a solid line and a dashed line respectively. The absolute values of voltages Vl1 and Vl2 are designated by a one-dot chain line and a two-dot chain line respectively. The graph also shows a difference 1201 between the absolute values of voltages Vl1 and Vl2 and a difference 1202 between the phases of voltages Vl1 and Vl2.

This being so, the noise immunity of the semiconductor device is judged as being poor, if noise current frequency fI is in a range where the absolute value difference 1201 exceeds its maximum tolerance.

Also, the noise immunity of the semiconductor device is judged as being poor, if noise current frequency fI is in a range where the phase difference 1202 exceeds its maximum tolerance.

CONCLUSION

According to the noise immunity evaluation method of the seventh embodiment, the absolute values and phases of voltages Vl1 and Vl2 are calculated according to noise current frequency. Based on the difference of the absolute values and the difference of the phases, a range of noise current frequencies where the noise immunity is poor can be specified.

If the same processing is performed by fixing the noise current frequency and instead varying the noise current amplitude, a range of noise current amplitudes where the noise immunity is poor can be specified.

Also, if the same processing is performed by fixing the noise current frequency and amplitude and instead varying a specific impedance, a range of values of such an impedance for attaining desired noise immunity can be determined.

Also, the noise source equivalent circuits 7011 and 7012 may each have a voltage source and a resistor connected in series.

Modifications

The present invention has been described by way of the above embodiments, though it should be obvious that the invention is not limited to the above. Example modifications are given below.

The methods of the present invention may be realized by a computer program that is executed by a computer system. Such a computer program may be distributed as a digital signal.

The invention may also be realized by a computer-readable storage medium, such as a flexible disk, a hard disk, a CD-ROM (compact disk—read only memory), an MO (magneto-optical) disk, a DVD (digital versatile disk), a DVD-ROM, a DVD-RAM, or a semiconductor memory, on which the computer program or digital signal mentioned above is recorded.

The computer program or digital signal that achieves the invention may also be transmitted via a network, such as an electronic communications network, a wired or wireless communications network, or the Internet.

The invention can also be realized by a computer system that includes a microprocessor and a memory. In this case, the computer program can be stored in the memory, with the microprocessor operating in accordance with this computer program to achieve the invention.

The computer program or digital signal may be provided to an independent computer system by distributing a storage medium on which the computer program or digital signal is recorded, or by transmitting the computer program or digital signal via a network. The independent computer system may then execute the computer program or digital signal to function as the invention.

Although the present invention has been fully described by way of examples with reference to the accompanying drawings, it is to be noted that various changes and modifications will be apparent to those skilled in the art.

Therefore, unless such changes and modifications depart from the scope of the present invention, they should be construed as being included therein.

What is claimed is:

1. A noise immunity evaluation design apparatus for evaluating noise immunity using a software simulation that represents a design of a circuit for a semiconductor device comprising:
    an acquiring unit, acquiring the software simulation, the software simulation including a simulated external noise source, a simulated external circuit, an impedance of a design power supplying circuit, an impedance of a design logic circuit, and an impedance of a design grounding circuit, the noise immunity evaluation apparatus further comprising:
    a specifying unit, specifying a first frequency of a voltage generated by the noise source;
    a calculating unit, calculating a first voltage directly across the design logic circuit impedance when a voltage of the specified first frequency is applied;
    an outputting unit, outputting the specified first frequency and the calculated first voltage; and
    an evaluation unit operable to output an evaluation of the noise immunity of the simulation circuit model, for the first frequency of a voltage generated by the noise source in comparison with a predetermined tolerance level for external noise where the evaluation is utilized to modify at least one of the impedances until the calculated first voltage falls within the predetermined tolerance level.

2. The noise immunity evaluation design apparatus of claim 1,
    wherein the power supplying circuit, the logic circuit, and the grounding circuit of the software simulation are connected in series with each other and form a simulated internal circuit, and the simulated internal circuit is connected in parallel with the simulated external noise source,
    the simulated external circuit, the simulated internal circuit, and the simulated noise source are connected in parallel with each other, and
    the calculating unit calculates the first voltage further using an impedance of the simulated external circuit.

3. The noise immunity evaluation design apparatus of claim 1,
    wherein the power supplying circuit, the logic circuit, and the grounding circuit form a simulated internal circuit, and are each made up of a plurality of circuit blocks,
    a circuit block of the power supplying circuit, a circuit block of the logic circuit, and a circuit block of the grounding circuit are connected in series with each other, and are respectively connected in parallel with a remaining circuit block of the power supplying circuit, a remaining circuit block of the logic circuit, and a remaining circuit block of the grounding circuit, and
    the calculating unit calculates a voltage arising directly across each circuit block of the logic circuit.

4. The noise immunity evaluation design apparatus of claim 3,
    wherein the external circuit, the internal circuit, and the noise source are connected in parallel with each other, and
    the calculating unit calculates voltage arising directly across each circuit block of the logic circuit, further using an impedance of the external circuit.

5. A noise immunity evaluation method used in a noise immunity evaluation apparatus for evaluating noise immunity using a computer generated simulation model, the simulation model including a noise source, an impedance of a power supplying circuit, an impedance of a logic circuit, and an impedance of a grounding circuit, the noise immunity evaluation method comprising:
    a specifying step of specifying a frequency of a voltage generated by the noise source;
    a calculating step of calculating a first voltage arising directly across the logic circuit impedance when a voltage of the specified frequency is applied;
    an outputting step of outputting the specified frequency and the calculated first voltage, and
    an evaluation step to compare the specified frequency and the calculated first voltage with a predetermined tolerance level for external noise and output an indication whether the calculated first voltage falls within the tolerance level.

6. The noise immunity evaluation method of claim 5,
    wherein the power supplying circuit, the logic circuit, and the grounding circuit are connected in series with each other and form a simulated internal circuit, and
    the simulated internal circuit is connected in parallel with the noise source,
    the simulation model further includes a simulated external circuit which is provided outside the simulated internal circuit,
    the simulated external circuit, the simulated internal circuit, and the noise source are connected in parallel with each other, and
    the calculating step calculates the first voltage further using an impedance of the simulated external circuit.

7. The noise immunity evaluation method of claim 5,
    wherein the power supplying circuit, the logic circuit, and the grounding circuit form a simulated internal circuit, and are each made up of a plurality of circuit blocks, a circuit block of the power supplying circuit, a circuit block of the logic circuit, and a circuit block of the grounding circuit are connected in series with each other, and are respectively connected in parallel with a remaining circuit block of the power supplying circuit, a remaining circuit block of the logic circuit, and a remaining circuit block of the grounding circuit, and the calculating step calculates voltage arising directly across each circuit block of the logic circuit.

8. The noise immunity evaluation method of claim 7, wherein the simulation model further includes a simulated external circuit which is provided outside the simulated internal circuit, the simulated external circuit, the simulated internal circuit, and the noise source are connected in parallel with each other, and the calculating step calculates voltage arising directly across each circuit block of the logic circuit, further using an impedance of the simulated external circuit.

9. A program recording medium which is readable by a computer in a noise immunity evaluation apparatus for evaluating noise immunity using a simulation model, the simulation model including a noise source, an impedance of a power supplying circuit, an impedance of a logic circuit, and an impedance of a grounding circuit, wherein a computer program embodied on the program recording medium has the computer conduct:

a specifing step of specifying a frequency of a voltage generated by the noise source;

a calculating step of calculating a first voltage directly across the logic circuit impedance when a voltage of the specified frequency is applied; and an outputting step of outputting the specified frequency and the calculated first voltage.

10. The program recording medium of claim 9, wherein the power supplying circuit, the logic circuit, and the grounding circuit are connected in series with each other and form a simulated internal circuit, and the simulated internal circuit is connected in parallel with the noise source, the simulation model further includes a simulated external circuit which is provided outside the simulated internal circuit, the simulated external circuit, the simulated internal circuit, and the noise source are connected in parallel with each other, and the calculating step calculates the first voltage further using an impedance of the external circuit.

11. The program recording medium of claim 9, wherein the power supplying circuit, the logic circuit, and the grounding circuit form a simulated internal circuit, and are each made up of a plurality of circuit blocks, a circuit block of the power supplying circuit, a circuit block of the logic circuit, and a circuit block of the grounding circuit are connected in series with each other, and are respectively connected in parallel with a remaining circuit block of the power supplying circuit, a remaining circuit block of the logic circuit, and a remaining circuit block of the grounding circuit, and the calculating step calculates a voltage arising directly across each circuit block of the logic circuit.

12. The program recording medium of claim 11, wherein the simulation model further includes a simulated external circuit which is provided outside the simulated internal circuit, the simulated external circuit, the simulated internal circuit, and the noise source are connected in parallel with each other, and the calculating step calculates voltage arising directly across each circuit block of the logic circuit, further using an impedance of the simulated external circuit.

13. The noise immunity evaluation design apparatus of claim 1 wherein the evaluation unit utilizes a difference in one of an absolute value and phase of the voltages and currents between the respective circuits.

14. The noise immunity evaluation method of claim 5 further including a step of altering one or more of the impedances of the respective power supplying circuit, logic circuit and ground current and repeating the specifying step, calculating step, outputting step and evaluation step until the computer generated simulation model is within the predetermined tolerance level for external noise.

15. The program recording medium of claim 9 further including a step of altering one or more of the impedances of the respective power supplying circuit, logic circuit and ground current and repeating the specifying step, calculating step, outputting step and evaluation step until the calculated first voltage lies within a predetermined tolerance level for external noise.

* * * * *